US011773570B2

(12) United States Patent
Hyde et al.

(10) Patent No.: US 11,773,570 B2
(45) Date of Patent: Oct. 3, 2023

(54) MONITORING GROUND ENGAGING PRODUCTS FOR EARTH WORKING EQUIPMENT

(71) Applicant: ESCO GROUP LLC, Portland, OR (US)

(72) Inventors: Steven D. Hyde, Portland, OR (US); Jason W. Betournay, Portland, OR (US); Christopher D. Snyder, Portland, OR (US)

(73) Assignee: ESCO GROUP LLC, Portland, OR (US)

( * ) Notice: Subject to any disclaimer, the term of this patent is extended or adjusted under 35 U.S.C. 154(b) by 253 days.

(21) Appl. No.: 16/888,389

(22) Filed: May 29, 2020

(65) Prior Publication Data

US 2020/0378091 A1 Dec. 3, 2020

Related U.S. Application Data

(60) Provisional application No. 62/855,783, filed on May 31, 2019.

(51) Int. Cl.
*E02F 9/28* (2006.01)
*E02F 9/26* (2006.01)
(Continued)

(52) U.S. Cl.
CPC ............ *E02F 9/2833* (2013.01); *E02F 9/267* (2013.01); *E02F 9/285* (2013.01); *E02F 9/2825* (2013.01);
(Continued)

(58) Field of Classification Search
CPC ....... E01F 9/2833; E01F 9/267; E01F 9/2825; E01F 9/285; E01F 9/2858; E01F 9/2883; G01V 3/081; G01V 3/12; G01R 33/072
See application file for complete search history.

(56) References Cited

U.S. PATENT DOCUMENTS 5,743,031 A 4/1998 Launder et al.
6,870,485 B2 3/2005 Lujan et al.
(Continued)

FOREIGN PATENT DOCUMENTS

AU 2012215112 8/2012
WO 2012107848 A1 † 8/2012
(Continued)

OTHER PUBLICATIONS

Abdallah Alma'aitah, et al., "Utilizing Sprouts WSN Platform for Equipment Detection and Localiztion in Harsh Environments", 13th Annual IEEE Workshop on Wireless Local Networks, Edmonton, Canada, 2014, p. 777-783.†

*Primary Examiner* — Gary S Hartmann
(74) *Attorney, Agent, or Firm* — Steven Schad; Palmer Dzurella

(57) ABSTRACT

A monitoring device and system located in a hole in a base of a ground engaging product for monitoring a characteristic of the ground engaging product. The characteristic can pertain to presence, part ID, condition, usage and/or performance of ground-engaging product secured to the earth working equipment. The monitoring system may detect the presence and/or absence of one or more of the components of the ground engaging product.

27 Claims, 15 Drawing Sheets

(51) Int. Cl.
*G01V 3/12* (2006.01)
*G01V 3/08* (2006.01)

(52) U.S. Cl.
CPC ............ *E02F 9/2858* (2013.01); *G01V 3/081* (2013.01); *G01V 3/12* (2013.01)

(56) References Cited

U.S. PATENT DOCUMENTS

| | | | |
|---|---|---|---|
| 6,986,216 B2 | 1/2006 | Emrich et al. | |
| 7,536,811 B2 | 5/2009 | McClanahan | |
| 3,411,930 A1 | 4/2013 | Ridley et al. | |
| 9,222,243 B2 | 12/2015 | Cheyne et al. | |
| 10,011,975 B2 * | 7/2018 | Carpenter | E02F 9/26 |
| 10,612,213 B2 * | 4/2020 | Carpenter | E02F 9/26 |
| 10,612,214 B2 | 4/2020 | Zenier et al. | |
| 10,633,831 B2 * | 4/2020 | Carpenter | E02F 9/2833 |
| 10,633,832 B2 * | 4/2020 | Carpenter | E02F 9/2841 |
| 10,669,698 B2 * | 6/2020 | Carpenter | E02F 9/26 |
| 10,787,792 B2 * | 9/2020 | Carpenter | E02F 9/2841 |
| 11,035,102 B2 | 6/2021 | Espejo Pina et al. | |
| 11,162,246 B2 * | 11/2021 | Kean | E02F 3/7636 |
| 11,371,222 B2 * | 6/2022 | Marquez Llinas | E02F 9/2833 |
| 11,401,682 B2 * | 8/2022 | Harder | E02F 3/401 |
| 2002/0078607 A1 | 6/2002 | Perry et al. | |
| 2003/0112153 A1 | 6/2003 | Lujan et al. | |
| 2004/0227645 A1 | 11/2004 | Lujan et al. | |
| 2016/0109608 A1 † | 4/2016 | Branson | |
| 2017/0254051 A1 † | 9/2017 | Hassanein et al. | |
| 2018/0038083 A1 | 2/2018 | Reyes-Rodriguez et al. | |
| 2019/0153703 A1 * | 5/2019 | Hyde | E02F 9/2808 |
| 2019/0338497 A1 † | 11/2019 | Espejo Pina et al. | |
| 2020/0088617 A1 † | 3/2020 | Marquez Llinas et al. | |
| 2020/0370280 A1 * | 11/2020 | Carpenter | E02F 9/2833 |
| 2020/0393303 A1 * | 12/2020 | Betournay | G01N 25/72 |

FOREIGN PATENT DOCUMENTS

| | | |
|---|---|---|
| WO | WO2012/107848 A1 | 8/2012 |
| WO | 2012116408 A1 † | 9/2012 |
| WO | 2014/026742 | 2/2014 |
| WO | 2016131015 A2 † | 8/2016 |
| WO | WO2016/131015 | 8/2016 |
| WO | 2018095536 A1 † | 5/2018 |
| WO | WO2018/095536 A1 | 5/2018 |
| WO | 2020007958 A1 † | 1/2020 |
| WO | 2020120718 A1 † | 6/2020 |

* cited by examiner
† cited by third party

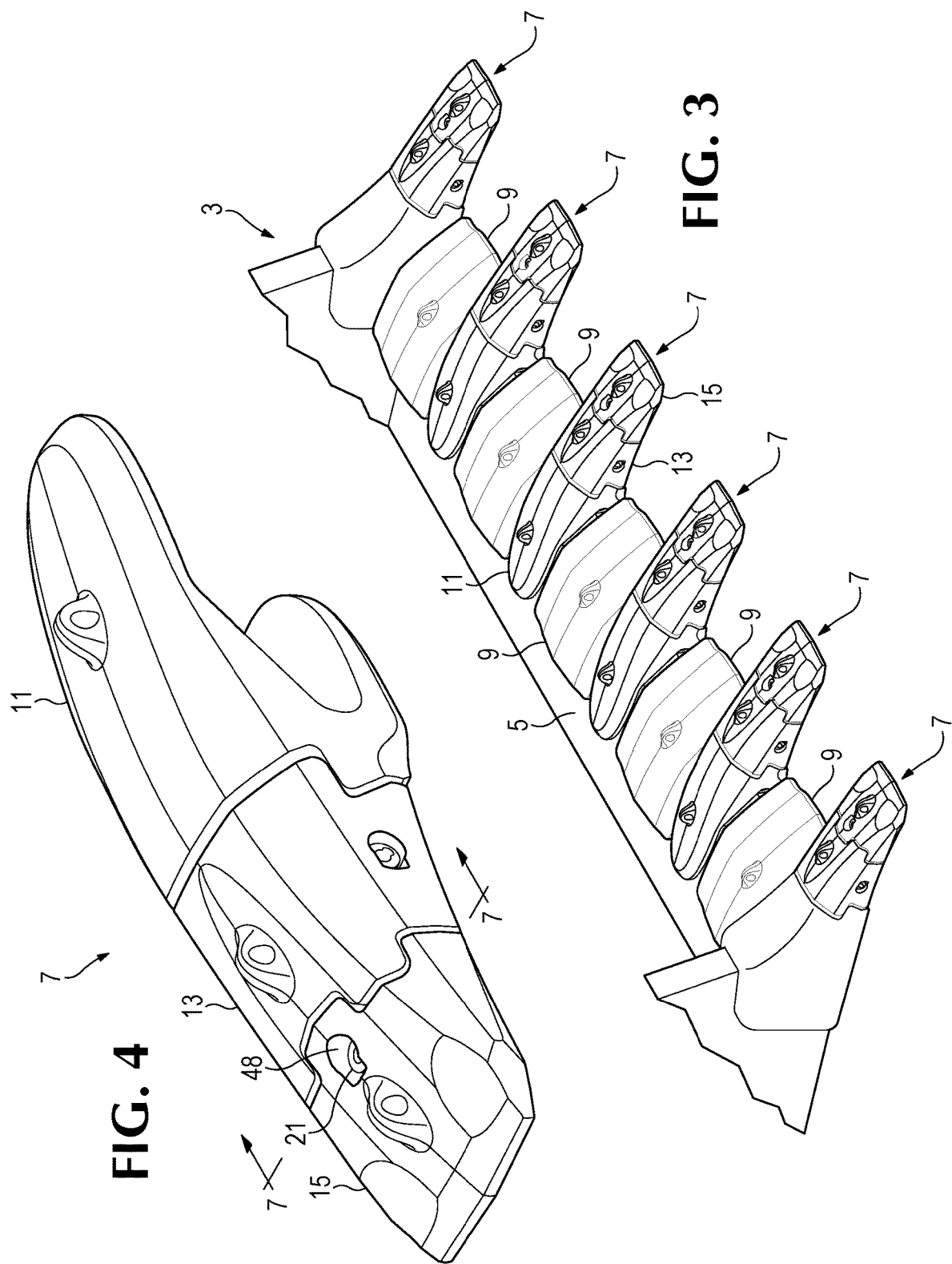

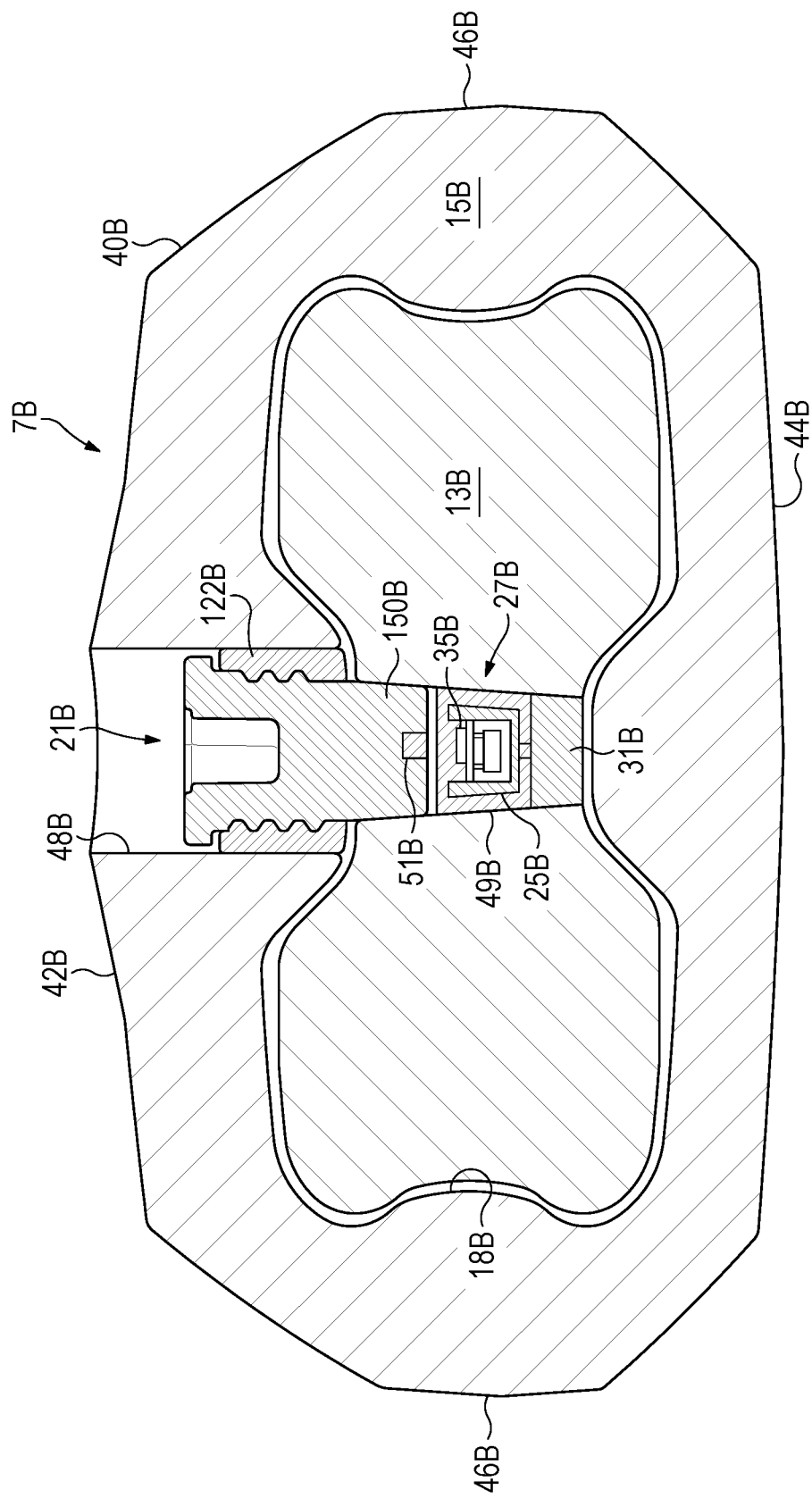

MONITORING GROUND ENGAGING PRODUCTS FOR EARTH WORKING EQUIPMENT

FIELD OF THE DISCLOSURE

The present disclosure pertains to a device and system for monitoring ground-engaging products such as ground engaging tools and the like used on various kinds of earth working equipment.

BACKGROUND OF THE DISCLOSURE

In earth working activities (e.g., mining and construction), ground engaging products are commonly provided on all kinds of earth working equipment to protect the underlying equipment from undue wear and, in some cases, also perform other functions such as breaking up the ground ahead of a digging edge. Ground engaging products include, for example, teeth and shrouds that are secured to the lip of a bucket.

Heavy loading and abrasive conditions can cause ground engaging products to become separated from the earth working equipment. The operators of earth working equipment are not always able to see when a ground engaging product has separated. A separated ground engaging product may cause damage to downstream processing equipment. For example, if a separated ground engaging product is fed into a crusher, the product may be ejected and cause a hazard to workers, or it may become jammed and cause costly crusher downtime. A jammed crusher requires shutting down the machine and having an operator dislodge the part, which at times may be a difficult, time-consuming and/or hazardous process. Additionally, continuing to operate the excavating equipment with missing ground engaging products can decrease overall productivity, and may cause the base, upon which the product was secured, to experience premature wear.

There are prior systems that have been proposed to determine when a wear part has been lost. For example, the missing tooth detection system sold by Motion Metrics uses an optical camera mounted on the boom of the excavating equipment to determine when wear parts are lost. Likewise, U.S. Pat. No. 8,411,930 discloses a system that relies on a video camera mounted to the boom of an excavating machine for detecting damaged or missing wear members. In U.S. Pat. No. 6,870,485, a spring-loaded switch is provided between wear part components so that when the components separate, the switch activates a radio transmitter alerting the operator that a wear part has separated. In U.S. Pat. No. 5,743,031, an actuator is secured to a wear part component to provide a smoke or radio signal when the wear part has fallen off.

SUMMARY OF THE DISCLOSURE

The present disclosure pertains to devices and systems for monitoring ground-engaging products for earth working equipment. The system can be used to monitor characteristics of ground-engaging products (such as presence, part identification, condition, performance, and/or usage of ground-engaging products) used on earth working equipment in mining, construction and other earth working operations.

In one embodiment, a wear assembly for earth working equipment includes a base securable to the earth working equipment and having a mounting portion having a hole. A wear part has a cavity to receive the mounting portion of the base, and an opening that at least partially aligns with the hole in the base. A lock is received in the opening in the wear part and the hole in the base to secure the wear part to the base. A monitoring device is in the hole in the base adjacent the lock when the lock is received in the hole to detect the presence and/or absence of the lock, and to wirelessly transmit a signal to indicate when the lock is absent from the base.

In another embodiment, a wear assembly for earth working equipment includes a base securable to the earth working equipment and having a mounting portion having an exterior surface, a wear part having a cavity receiving the mounting portion of the base, a lock to secure the wear part to the base, a hole in the base that opens in the exterior surface of the base to oppose the wear part or the lock when the base, wear part and lock are assembled together, and a monitoring device in the hole and facing outward from the exterior surface in close proximity to the wear part or the lock, the monitoring device being free of movable components to detect the presence and/or absence of the wear part or lock, and to transmit a wireless signal when the wear part or lock is detected as absent.

In another embodiment, a wear assembly for earth working equipment includes a base securable to the earth working equipment and having a mounting portion and a hole that opens in the mounting portion. A wear part has a cavity for receiving the mounting portion of the base. A lock secures the wear part to the base. A proximity device is on the wear part or the lock. A monitoring device is in the hole in the base to detect the presence and/or absence of the proximity device, and to send a wireless signal when the proximity device is absent.

In another embodiment, a wear assembly for earth working equipment including a base securable to the earth working equipment and including a hole, a wear part including a cavity receiving at least a portion of the base, a lock to secure the wear part to the base, and a monitoring device in the base to detect a characteristic of the wear part and/or the base, the characteristic including at least one of a condition, usage, performance and/or part identification of the wear part and/or the base.

In another embodiment, a wear assembly for earth working equipment includes a base securable to the earth working equipment and including a hole, a wear part having a cavity receiving at least a portion of the base, a lock to secure the wear part to the base, and a monitoring device in the hole to detect temperature change and to transmit a signal when the temperature change reaches a threshold level.

In another embodiment, a monitoring system for monitoring a ground-engaging product secured to an earth working equipment includes a base attachable to the earth working equipment and having a front end and a hole opening in the front end, a wear part having an exterior surface subject to wear during use and a mounting cavity for receiving the front end of base, a lock to secure the wear part to the base, a monitoring device in the hole of the base, the monitoring device including a first sensor, a second sensor, a communication device for wirelessly transmitting information from the first and second sensors, and a battery, and a programmable logic device to use the information from the first sensor to identify separation of the wear part from the base and information from the second sensor to identify separation of the base from the earth working equipment.

In another embodiment, a component of a ground-engaging product for earth working equipment, the component comprising a mounting portion securable to the earth working equipment, an exterior surface with a hole, and a monitoring device in the hole including a temperature sensor and a communication device to wirelessly transmit information from the temperature sensor.

In another embodiment, a wear assembly for earth working equipment includes a base having a rear end for securing to the earth working equipment, a front mounting portion, and a hole opening in the mounting portion. A wear part is received over the mounting portion and includes an opening in at least partial alignment with the hole in the base. A lock secures the war part to the base. A monitoring device is in the hole in the base to detect the whether the wear part has separated from the base, and to transmit a wireless signal when the wear part has separated.

In another embodiment, a wear assembly for earth working equipment includes a digging edge with a monitoring device. A wear part has a cavity for receiving the digging edge, and an opening. A lock is received in the opening to secure the shroud to the digging edge. The monitoring device is secured to the digging edge to detect when the wear part has separated from the digging edge and to transmit a wireless signal when the wear part has separated.

In another embodiment, a monitoring system for monitoring a ground-engaging product secured to an earth working equipment that includes a base attachable to the earth working equipment and having a front end, and a wear part having an exterior surface subject to wear during use and a mounting cavity for receiving the front end of base. A lock secures the wear part to the base. A monitoring device is secured to the base and includes an electronic device to identify a characteristic of the wear part and a communication device to wirelessly communicate information about the characteristic. A remote device remote from the monitoring device is provided to wirelessly communicate with the communication device to receive the information about the characteristic.

In another embodiment, a monitoring system for monitoring a ground-engaging product secured to an earth working equipment includes a base that is attachable to the earth working equipment and which has a front end, a top surface, a bottom surface, and side surfaces, and a first hole in at least one of the top, bottom, and/or side surfaces. A wear part that has an exterior surface subject to wear during use, a mounting cavity defining an interior surface for receiving the front end of base, and a second hole, the second hole being in a different position from the first hole. A lock is in the second hole to secure the ground engaging product to the base. A monitoring device is in the first hole and secured to the base and includes an electronic device for identifying a characteristic of the wear part and a communication device for wirelessly communicating information about the characteristic. A remote device is remote from the monitoring device to wirelessly communicate with the communication device to receive the information about the characteristic.

In another embodiment, a monitoring system for monitoring a ground-engaging product secured to an earth working equipment, the system includes a base with a front end, a top surface, a bottom surface, and side surfaces, and a first hole in at least one of the top, bottom, and/or side surfaces. A wear part that has an exterior surface subject to wear during use, a mounting cavity defining an interior surface for receiving the front end of base, and a second hole, wherein the second hole is generally aligned with the first hole. A lock is secured in the first and second hole to secure the wear part to the base. The lock has a magnet secured to a leading end. A monitoring device is secured to the base and includes a Hall effect sensor for identifying whether the wear part has separated from the base from the absence or presence of the magnet, and a communication device for wirelessly communicating information about the characteristic.

In one other example of the disclosure, a system may include a monitoring device associated with a wear part, a base, at least one remote device to cooperate with the monitoring device, and a programmable logic device to process the information communicated between the devices. The ground engaging product may be a point, tip, pick, shroud, or adapter. The base may be a lip of an earth working equipment, an intermediate adapter, or a base adapter. The programmable logic device uses the information to determine characteristics of the wear part including, e.g., part identification, presence, performance and/or usage of the ground engaging product attached to the earth working equipment. In one alternative example, the programmable logic device may be in communication with a display. In another example, the monitoring system may issue an alert signal. The alert signal may be transmitted after the ground engaging product has been removed leaving behind an open exterior path for the communication device of the monitoring device to have a clear path of communication.

In another example of the disclosure, a monitoring device is provided within a lock-receiving opening in the base that supports a wear part. In one example, the monitoring device includes at least one sensor, a wireless communication device and/or a battery contained within the lock receiving opening. The monitoring device may have a non-metal body securing the components of the device into a stable position and aiding in controlling the height desired for some sensors. The monitoring device being located adjacent a leading end or sidewall of the lock. In one example, a remote device being remote from the monitoring device wirelessly communicates with the communication device to receive the information about the characteristic. In one example, the lock-receiving opening extends inward from one of a top, bottom, or side surface of the base and the monitoring device is in the hole.

In an alternative implementation, the monitoring system may further include a proximity device. In one example, the proximity device may be located on a leading end of a lock. The leading end of the lock being opposite to a driving outer or top surface of the lock. In an alternative example, the proximity device may be located in an aperture and affixed in a resin material. In one example, the proximity device is a RFID tag and the electronic device is a RFID receiver. Alternatively, the electronic device is a RFID tag, such that signal strength of the RFID tag in the base is monitored. In another example, the proximity device is a magnet and the at least one sensor is a Hall effect sensor.

In another example of the disclosure, a monitoring device is secured to a base proximate but separate from the lock securing the wear part to the earth working equipment to detect a characteristic of the wear part such as the presence and/or loss of the lock.

In another example, a monitoring system includes a base having a first hole in at least one of the top, bottom, and/or side surfaces; a wear part having an exterior surface subject to wear during use, a mounting cavity defining an interior surface for receiving the front end of base, and a second hole, the second hole being in a different position from the first hole; a lock secured in the second hole to secure the ground engaging product to the base; and a monitoring device. The monitoring device may be situated in the first hole and secured to the base. In one example, the monitoring device includes an electronic device for identifying a characteristic of the ground engaging product and a communication device for wirelessly communicating information about the characteristic, the communication device being located proximate at least one of the top, bottom, and/or side surfaces of the base. In one example, the system further includes a remote device remote from the monitoring device to wirelessly communicate with the communication device to receive the information about the characteristic.

In an alternative implementation, a monitoring system includes a base having a front end, a top surface, a bottom surface, and side surfaces, and a first hole in at least one of the top, bottom, and/or side surfaces; a wear part having an exterior surface subject to wear during use, a mounting cavity defining an interior surface for receiving the front end of base, and a second hole, the second hole being in aligned with the first hole; a lock secured in the first and second hole to secure the ground engaging product to the base, the lock having a magnet secured to a leading end of the lock; and a monitoring device secured to the base. In one example, the monitoring device includes an Hall effect sensor for identifying a characteristic of the ground engaging product from the absence or presence of the magnet and a communication device for wirelessly communicating information about the characteristic, the communication device being located adjacent and below a leading end of the lock. The hall effect sensor may be able to detect a dislodging event and a total loss event.

BRIEF DESCRIPTION OF THE DRAWINGS

FIG. 3 is a perspective view of a lip of a bucket with teeth and shrouds.
FIG. 4 is a perspective view of one of the tooth assemblies shown in FIG. 3.
FIG. 7B is a cross-sectional view taken along line 7-7 in FIG. 4, showing a second example of a monitoring system according to the present disclosure.

DETAILED DESCRIPTION OF PREFERRED EXAMPLES

The present disclosure pertains to devices and systems for monitoring characteristics of ground-engaging wear parts for use on earth working equipment. The monitored characteristics may include, for example, presence, part identification, condition, performance and/or usage of ground-engaging products on the earth working equipment. As examples, the devices and systems can be used to monitor ground-engaging products secured to dozers, loaders, dragline machines, cable shovels, face shovels, hydraulic excavators, dredge cutters, buckets, lips, rippers, shear drums, continuous miners, crushers, etc. Examples of wear parts for such ground-engaging products include points, base adapters, intermediate adapters, shrouds, upper and lower wing shrouds, runners, picks, wear plates, tips, etc. Some of the example wear parts (e.g., base adapters or intermediate adapters) can also be considered a base because they in turn support other components.

Relative terms such as front, rear, top, bottom and the like are used for convenience of discussion. The terms front or forward are generally used to indicate the usual direction of travel of the ground engaging product relative to the earthen material during use (e.g., while digging), and upper or top are generally used as a reference to the surface over which the material generally passes when, for example, it is gathered into a bucket. Nevertheless, in the operation of various earth working equipment, the ground engaging products may be oriented in various ways and move in all kinds of directions during use.

For ease of discussion, the monitoring of ground engaging products secured to an excavating bucket is generally discussed herein, and in particular the monitoring of specific kinds of teeth and shrouds. However, the monitoring systems of the present disclosure could be used to monitor other kinds of teeth, other kinds of ground engaging products, and products on various types of earth working equipment. As examples only, the monitoring system may monitor a point on an adapter (intermediate or base), an intermediate adapter on a base adapter or integral cast nose, a shroud on a lip or base, a wear runner on a bucket, teeth on a dredge cutter head, picks on a shearer drum, liners on a chute or truck tray, tips in a roll crusher, and the like. The ground engaging products may be attached to various equipment and may be secured by various mechanical attachments including different locks and the like.

Figure 1:
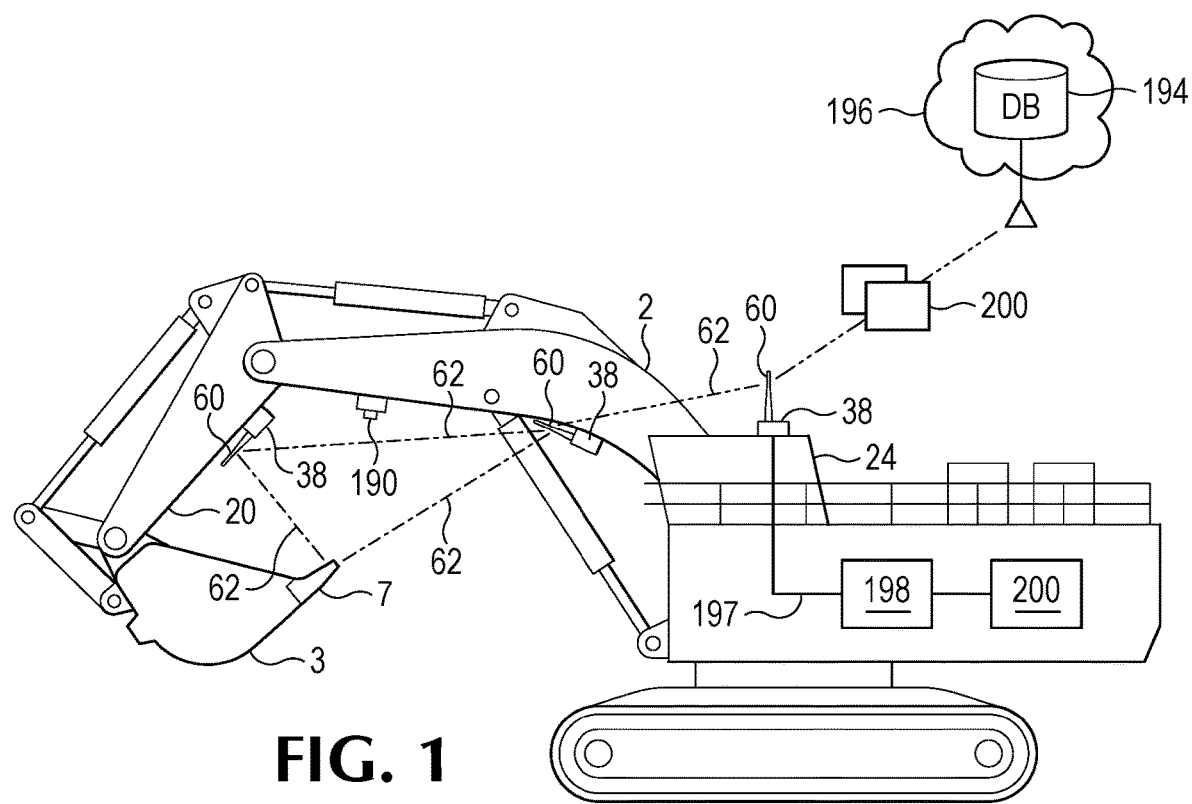
FIG. 1 is a side view of a mining excavator.
Figure 2:
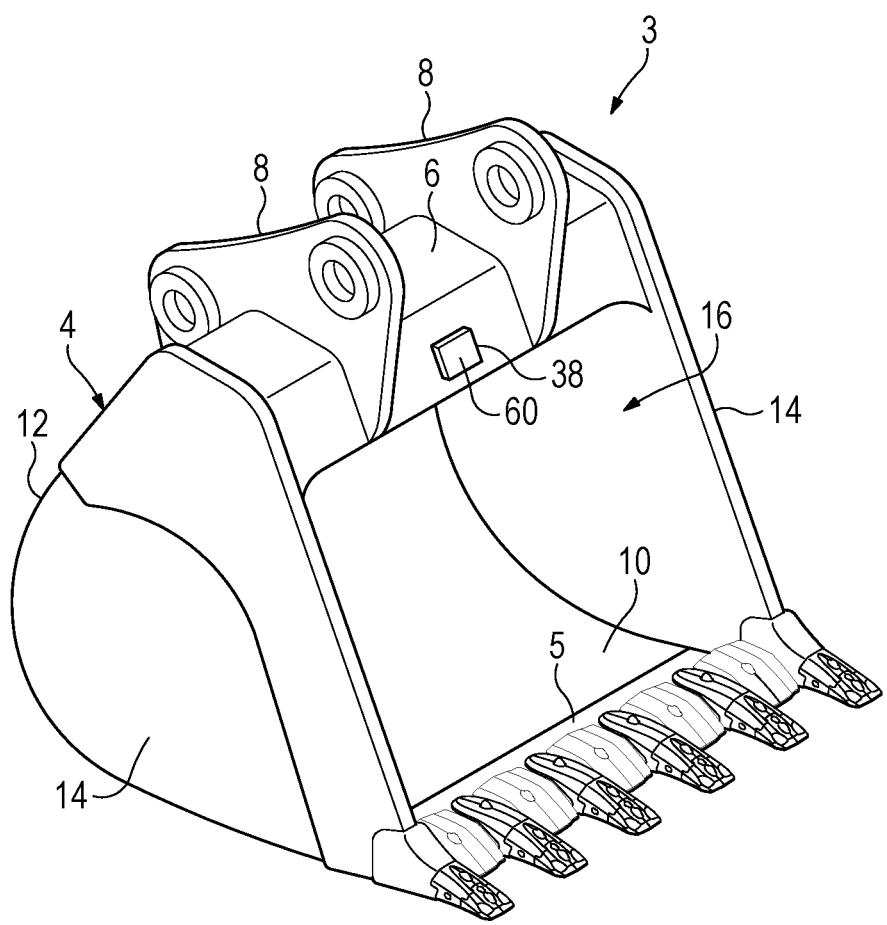
FIG. 2 is a perspective view of a hoe bucket.

Referring to FIGS. 1-2, a mining excavator 1 is equipped with a boom 2, a stick 20, and a bucket 3 for gathering earthen material while digging. The bucket 3 includes a frame or shell 4 defining a cavity 16 for gathering material during the digging operation (FIG. 2). Shell 4 includes a top wall 6 having attachment supports 8 to attach the bucket 3 to excavator 1, a bottom wall 10 opposite the top wall 6, a rear wall 12, and a pair of opposing sidewalls 14. Multiple configurations of buckets are known and variations in bucket geometry exist for excavating buckets and, of course, other excavating machines. For example, the bucket may not have a top wall as in a dragline bucket, the bottom wall may be hinged as in a dipper bucket, or a portion of the side walls may be hinged as in a hydraulic face shovel. The specific geometry of the bucket is not intended to be limiting as the present system can be used with various types of buckets and with various types of ground engaging products used on the buckets or other earth working equipment.

Figure 5:
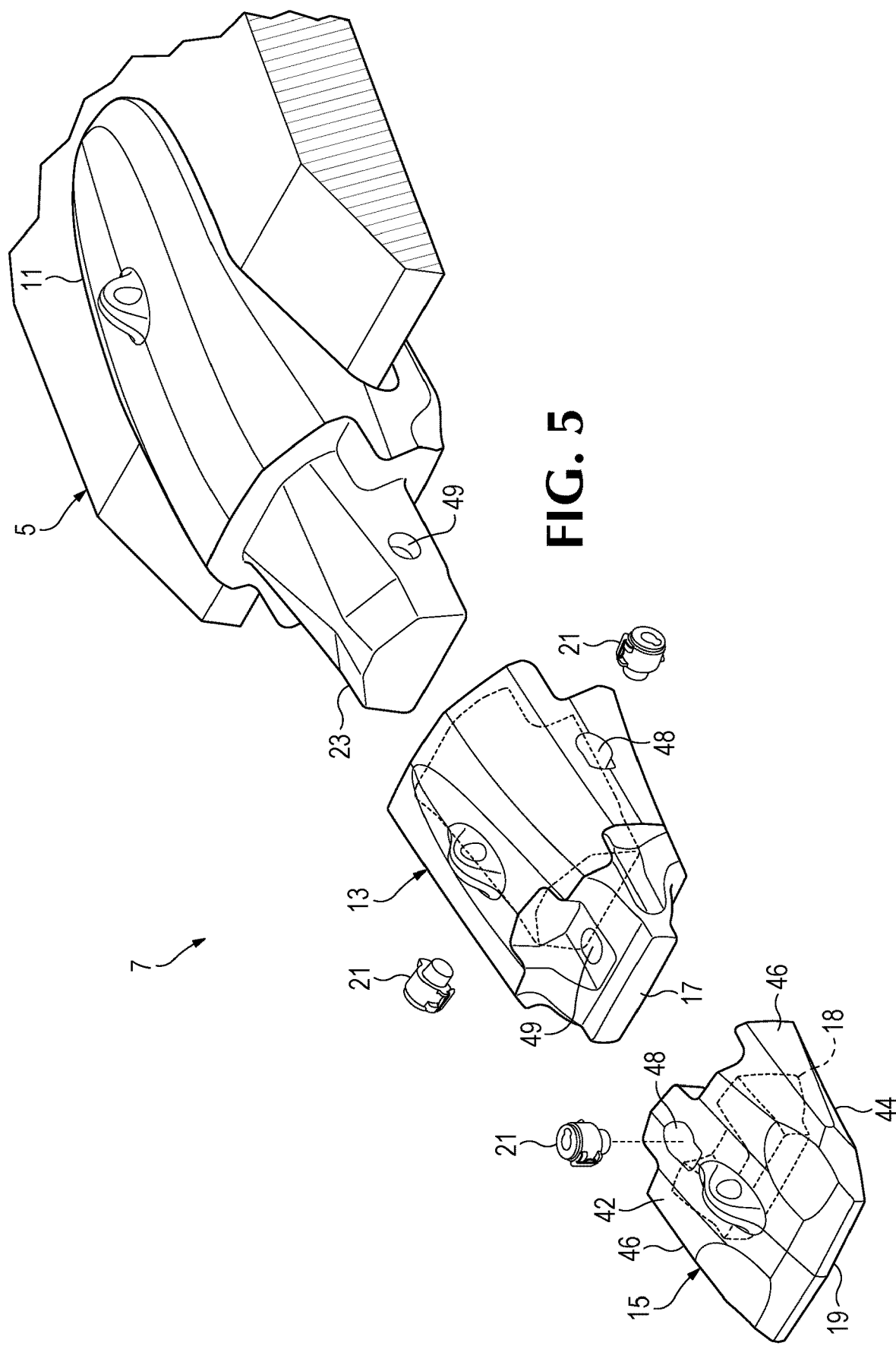
FIG. 5 is an exploded perspective view of the tooth assembly in FIG. 4 with the adapter secured to a lip.

In the illustrated example, bucket 3 has a digging edge 5 (FIGS. 2-3 and 5). The digging edge 5 is that portion of the equipment that leads the contact with the ground and in an excavator bucket is generally formed by a lip. Sidewalls 14 of a bucket 3 commonly also form a portion of the digging edge and at times include wear parts. Teeth and/or shrouds are often secured to the digging edge to protect the edge, break up the ground ahead of the bucket 3 and/or gather material into the bucket. Multiple teeth 7 and/or shrouds 9, such as disclosed in U.S. Pat. Nos. 9,222,243 and 10,612,214, which are each incorporated by reference in its entirety, may be attached to lip 5 of bucket 3.

Referring to FIGS. 3-5, the illustrated tooth 7, provided only as an example, includes a base adapter 11 welded to lip 5, an intermediate adapter 13 mounted on adapter 11, and a point (also called a tip) 15 mounted on intermediate adapter. Point 15 includes a rearward-opening cavity 18 to receive nose 17, and a front end or bit portion 19 to penetrate the ground (FIG. 5). A lock opening 48 is formed in the point 15 and a hole 49 in the base 13 to receive a lock 21 that holds the point 15 to the base 13. For example, locks (also called retainers) 21 are used to secure point 15 to intermediate adapter 13, and intermediate adapter 13 to a nose 23 of the adapter 11. In this example, the locks 21 are all the same but they would not need to be. When a ground engaging product becomes unexpectedly separated from the base, the ground engaging product is preferably replaced soon so production does not decrease and the base, upon which the ground engaging product is attached, does not experience premature wear.

Figure 6:
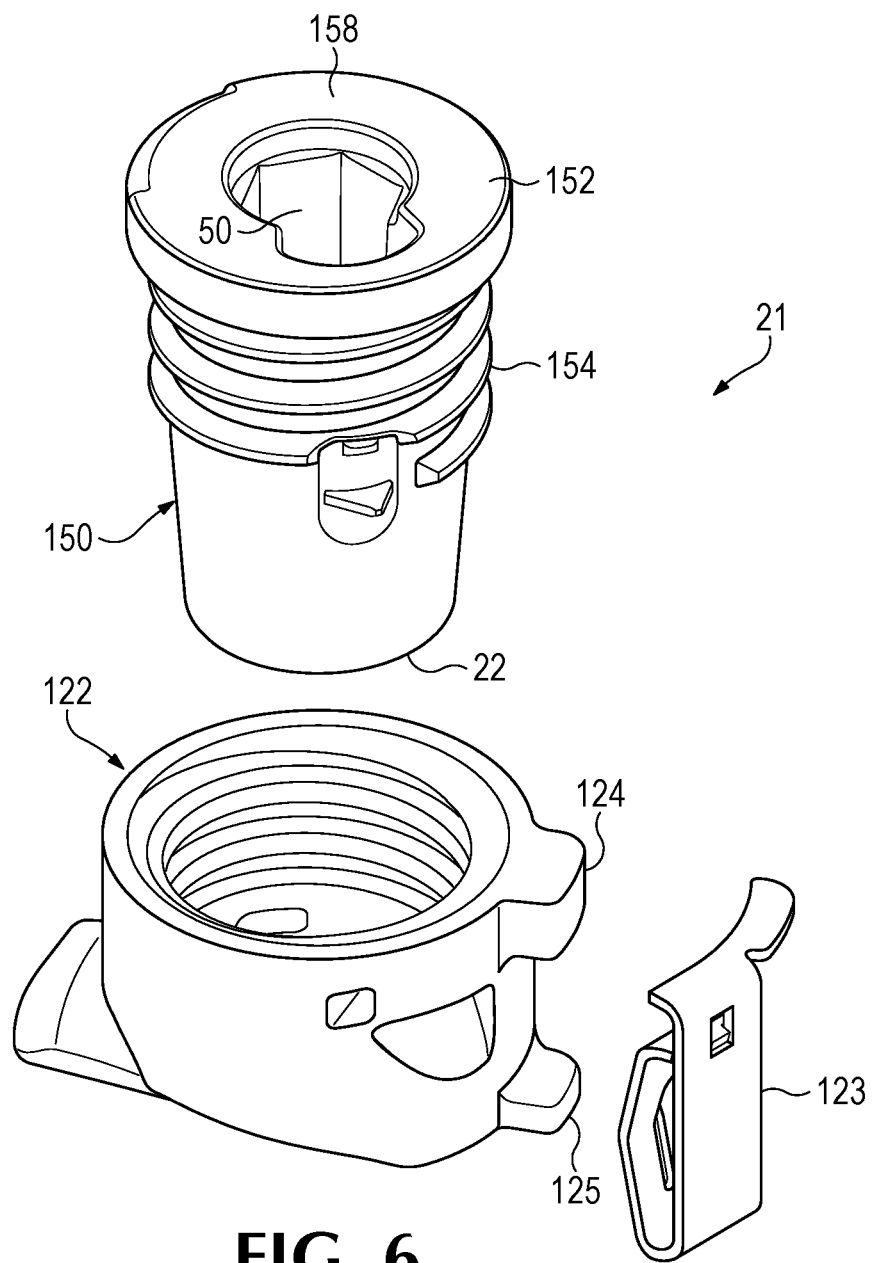
FIG. 6 is a perspective view of a lock of the tooth assembly.

Referring to FIG. 6, the lock 21 may include a pin 150 threaded into a collar 122. In one example, the collar 122 is secured in opening 48 in the tip 15, and a pin 150 is threaded through the collar 122 for inward and outward movement between hold and release positions, respectively; i.e., the pin 150 has a leading end 22 that is movable in and out of hole 49 in the base 13 to secure and release the wear part, respectively. In this example, lugs 124, 125 secure the collar into opening 48 bayonet style, and a clip 123 is used to prevent rotation and release of the collar from the opening; the collar could be secured in opening 48 in other ways. The pin 150 could also be secured without a collar; for example, the opening could include threads. A latch 126 in pin 150 is provided to secure the pin in the hold and release positions but other securing arrangements could be used, or the pin could be infinitely adjustable between positions where the point is secured, and the point can be released. In the hold position, a leading end 22 of the pin 150 is received into a hole 49 in the nose 17 to secure the point 15 onto the nose 17. In the illustrated example, the pin 150 includes a head 152 and a threaded shank 154 but other arrangements are possible. A recess 50 opens in an outside face 158 of the head 152 for receiving a tool (not shown) for turning the pin 150 for securing and releasing point 15. This is provided simply as an example; other locking arrangements (threaded or not) could be used to secure the point (or other wear part) to the adapter (or other base).

Figure 7A:
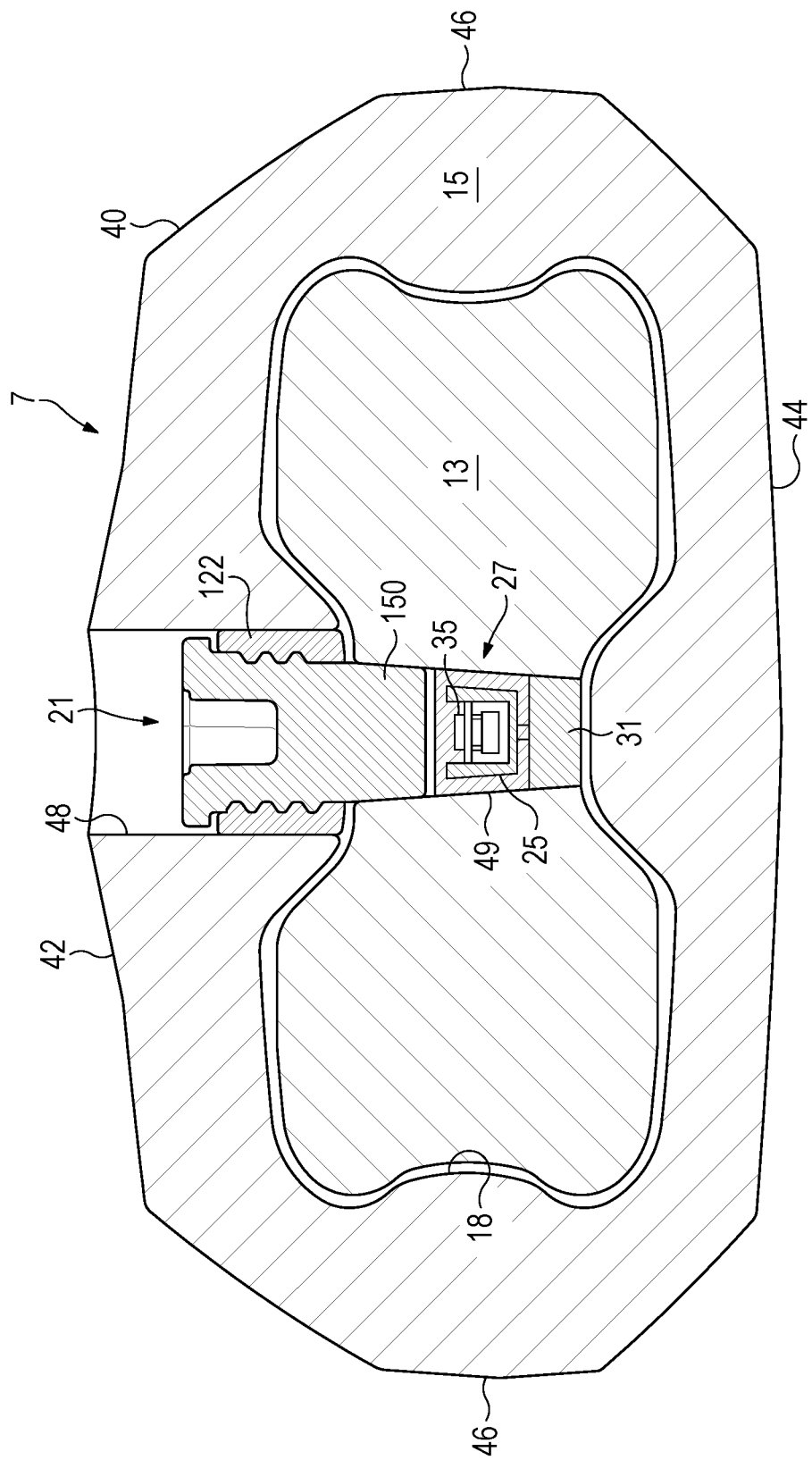
FIG. 7A is a cross-sectional view taken along line 7-7 in FIG. 4, showing a first example of a monitoring system according to the present disclosure.

Referring to FIG. 7A-7B, a monitoring system 27 includes a monitoring device 25 situated within a base hole 49 adjacent a lock 21. A tooth 7 is shown having a ground engaging product situated over a base (e.g. the illustrated point 15 is situated over an adapter 13), and a lock 21 to secure the wear part to the base. As can be seen, lock 21 is situated in both the grounding-engaging product lock opening 48 and the base hole 49 to secure the wear part to the base. Alternatively, a mounting portion of the wear part could set adjacent or otherwise complement a recess in the base.

In certain examples, monitoring system 27 includes a sensor(s) in the base and optionally a tag(s) or the like in and/or on the lock. Wear parts typically separate from a machine due to such things as impacts, high loads, fatigue, wear, etc. The wear part typically pulls the lock from the base during separation. If the lock 21 fails, the wear part will not ordinarily remain with the base during use of the earth working equipment. Accordingly, regardless of the reason for the separation, the lock ordinarily stays with the wear part (e.g., with locks integrally secured to the wear part) or is cast entirely out of the wear assembly due to the force on the wear part, breakage of the wear part, etc., when the wear part separates from an earth working machine. Since the lock is not normally retained in the lock-receiving hole in the base when the wear part separates from the machine, the sensor in the base can detect the absence of the lock to identify that the wear part has separated from the base. The monitoring device can also be used to determine if the base has separated from the earth working equipment, and thus also the wear part and lock associated with that base. In such a circumstance, the loss of a signal from the sensor(s) can identify that the base has separated from the earth working equipment.

Earth working equipment is commonly used in arduous environments where the survival of sensors is at risk. Having the monitoring device within a hole in the base supporting the wear part tends to provide improved protection for the components within the monitoring device (e.g., a sensor(s) and a communication device) as compared to being mounted in the wear part or the lock because it can be sheltered by a combined assembly of, e.g., the wear part, the lock, and the base. In some constructions, the hole within the base provides more room for the use of cushioning fillers for improved protection as compared to systems where a monitoring device is provided in the wear part or lock. Securing the monitoring device in the base as opposed to the wear part or the lock provides greater assurance the remote device to receive the signal from the monitoring device (i.e., indicating that the wear part has separated) will receive the signal, i.e., because the base ordinarily remains with the machine when the wear part is lost whereas the wear part or lock (if containing the sensor) could remain in the ground or be otherwise farther separated from the remote device when the wear part separates making it more likely the signal may not be received.

In the illustrated examples (FIGS. 1-8), the point 15 includes an external surface 40 having a top surface 42, a bottom surface 44 and side surfaces 46. Monitoring device 25 is positioned in hole 49 in base 13 so as to be adjacent the leading end 22 of pin 150 of lock 21 when the components of tooth 7 are assembled together (FIGS. 7A and 7B). In one example, the monitoring device 25 is received in hole 49 in base 13 prior to the installation of the lock 21, i.e., in the portion of hole 49 not to be occupied by pin 150 when the pin secures point 15 to adapter 13. In this position (i.e., in hole 49), the monitoring device 25 can be protected during the earth working operations, can provide reliable detection of characteristics of the wear part and/or base, can be used to monitor successive wear parts secured to the base, and/or can eliminate the need for batteries in the more quickly consumed wear parts. That is, by positioning the sensor(s) in the base, the more frequently replaced wear parts can be free of batteries and can be more easily discarded and/or recycled. By placing the monitoring device 25 in the base, the components have a better chance of survival by not being in direct contact with the environment. The monitoring device 25 may be installed in hole 49 as a part of the manufacturing process, in a shop and/or in the field. When the monitoring device 25 is installed in hole 49 at the time of manufacture, it may optionally be used to track shipping progress, inventory levels of the ground engaging products (e.g., adapters 13), and/or when ground engaging products are removed from inventory for use. In addition, the monitoring device 25 may optionally be able to detect if the ground engaging product experienced a condition (e.g., a high impact) that has the potential to damage the ground engaging product during shipping and/or use. Alternatively, monitoring device 25 may be installed after the manufacturing process and may, for example, be installed in hole 49 while in inventory or at the time of installation of a new ground engaging product on the earth working equipment.

The monitoring device 25 can, when installed, detect the presence and/or absence of the lock 21 (e.g., the pin of the lock in the illustrated embodiment) received in hole 49 when securing the wear part to the base. The monitoring device 25 may also optionally monitor other characteristics of the wear part and/or base such as the usage, condition and/or performance of the wear part and/or base, and/or part identification such as disclosed in U.S. Pat. No. 10,011,975 incorporated herein by reference. The monitoring device can also detect one or more of these other characteristics instead of the presence and/or absence of the lock and/or wear part. The monitoring of separation as well as other characteristics can be accomplished in a number of different ways. When absence of the lock is detected, the sensor can send a wireless alert signal to a remote device to alert the operator, maintenance personnel, manager, contractor, etc. that a wear part has separated from the machine.

In the illustrated example of FIG. 7B, monitoring system 27B includes a proximity device 51B secured to (i.e., in and/or on) the lock 21B and a sensor 35B in the base that can detect the presence of the proximity device 51B. In the illustrated example, the proximity device may be secured to or near the leading end 22 of pin 150B, and the monitoring device 25 placed in hole 49B so as to be adjacent the leading end 22 of pin 150 when the lock secures the wear part to the base. Alternatively, the proximity device could be located in the collar 122 (e.g., in the body or lugs 124, 125 of the collar 122). The monitoring device 25 could also alternatively be located in a hole offset but in communication with hole 49B so as to position monitoring device 25 adjacent a side of pin 150B and/or adjacent the collar 122. This position may have the advantage of utilizing the spacing in-between the wear member and the base for communications. Other variations are possible for the illustrated lock as well as other kinds of locks that may be used.

In one example, the proximity device 51B is a magnet, and the sensor 35 is a Hall effect sensor to detect the presence and/or absence of the magnet (e.g., locking pin 150 with magnet 51B). The Hall effect sensor 35B generates a current and measures a change in the electric potential due to an introduced static magnetic field. The static magnetic field may be generated by a magnet 51B but can be generated by other means. The Hall effect sensor 35B acts as a switch when detecting changes in Hall voltage as affected by the presence and/or absence of the magnet (e.g. changes in the electric field along a gradient, direction of electric field, etc.). If the magnet 51B is no longer in position to be detected by sensor 35B, then this indicates that the lock 21B has become dislodged or lost, and that the wear part has separated from the machine. The sensor 35B may have a predetermined set value for either the electric field (V/M) and/or the magnetic field (mT). The predetermined set value determines how sensitive (e.g. loss versus pre-loss or dislodging) the sensor 35B is to a distance D the magnet 51B is away from the sensor 35B. The predetermined set value may be static or dynamic (e.g. set between 3.9 mT to 63 mT). The sensor 35B does not suffer from vibration or contact bounce as a solid mechanical contact sensor would. The sensor 35B can generally be used in severe conditions without being affected by environmental contaminants and costs less than a mechanical switch. The sensor 35B can measure a wide range of magnetic fields.

In another example, the proximity device 51B is an RFID tag and/or other short-range detectable element can be secured to the lock 21 (e.g., to and/or in the leading end 22 of the pin 150). The RFID tag 51B is then detected by an RFID receiver sensor 35B (i.e., as part of the monitoring device 25) in hole 49 of base 13. When the wear part and lock separate from the base, sensor 35 loses signal with the RFID tag 51B. This loss of signal identifies that the wear part has separated from the base. In another example, the RFID receiver sensor 35 may keep track of each new RFID tag introduced so as to monitor inventory and replacement timing for the wear parts.

Other kinds of sensors could be used to detect the presence and/or absence of the pin 150 in hole 49, and/or detect other characteristics of the ground-engaging product. For example, the sensors may include a temperature sensor, a digital inclinometer unit, a digital compass, an accelerometer, a timer, a proximity sensor, a position sensor, a hall effect sensor, a flux magnetometer, a magnetometer, a magnetoresistance sensor, an inductive sensor, RFID tag and/or reader, IR receiver, ultrasonic and/or other sensors that can detect the presence and/or absence of the lock securing the ground engaging product to the base and/or other characteristics of the wear part and/or base. Some sensors involve the use of a proximity device on the lock and/or wear part (e.g., an RFID tag, magnet, and the like) and some do not involve such use of a tag or other proximity device on the lock and/or wear part). Although the use of a proximity sensor to detect a proximity device on the lock has been discussed above, other kinds of sensors could be used in lieu of or in addition to a proximity sensor. While monitoring devices that are free of moving parts are disclosed in various embodiments (e.g., Hall effect sensors), the monitoring device could include a sensor with a contact switch that contacts the lock or wear part and moves when the lock or wear part separates so as to identify the presence and/or absence of a lock and/or wear part. Monitoring devices free of such moving parts have less risk of failure due to accumulation of fines, damage caused by impacts, and the like. Monitoring devices free of such moving parts can also be encased and more securely protected by a body or filler material.

Monitoring device 25 can optionally include more than one sensor to increase the reliability of detecting the presence and/or absence of the lock and, hence, the presence and/or absence of the wear part mounted on the base. As one example only, monitoring device 25 can include a first sensor to sense a proximity device (e.g., a magnet, RFID tag and the like) on the lock as discussed above, and a second sensor to detect temperature changes. Continued digging with, e.g., a tooth after the point has separated will typically result in a temperature sensor in the base detecting an increase in temperature. The monitoring device 25 could transmit a signal when either sensor detects separation or only when both (or all if more than two are used) sensors detect separation or when some (if more than two sensors are provided) of the sensors detect separation. For example, the communication device may send a signal when the first sensor detects the wear part or lock is absent and/or when the second sensor detects that a threshold level temperature or increase in temperature is reached. Also, a programmable logic device receiving the transmitted signals could assess the information received from the sensors (e.g., the amount of temperature change, the amount of time that has lapsed since receiving a signal regarding the proximity device, etc.) and make a determination as to whether the wear part has separated from the base.

Including monitoring device 25 in base 13 can also optionally detect if the base has separated from the earth working equipment. As one example, the monitoring device could include an accelerometer and transmit signals about the movement of the base. Then, if the base separates from the equipment, it would have no movement (e.g., if in or on the ground) or a different movement (e.g., if gathered as part of the load). In either case, an alert could be provided to indicate the base had separated. Separation of the base would, of course, also mean separation of the wear part and lock securing the wear part to the base.

Figure 8:
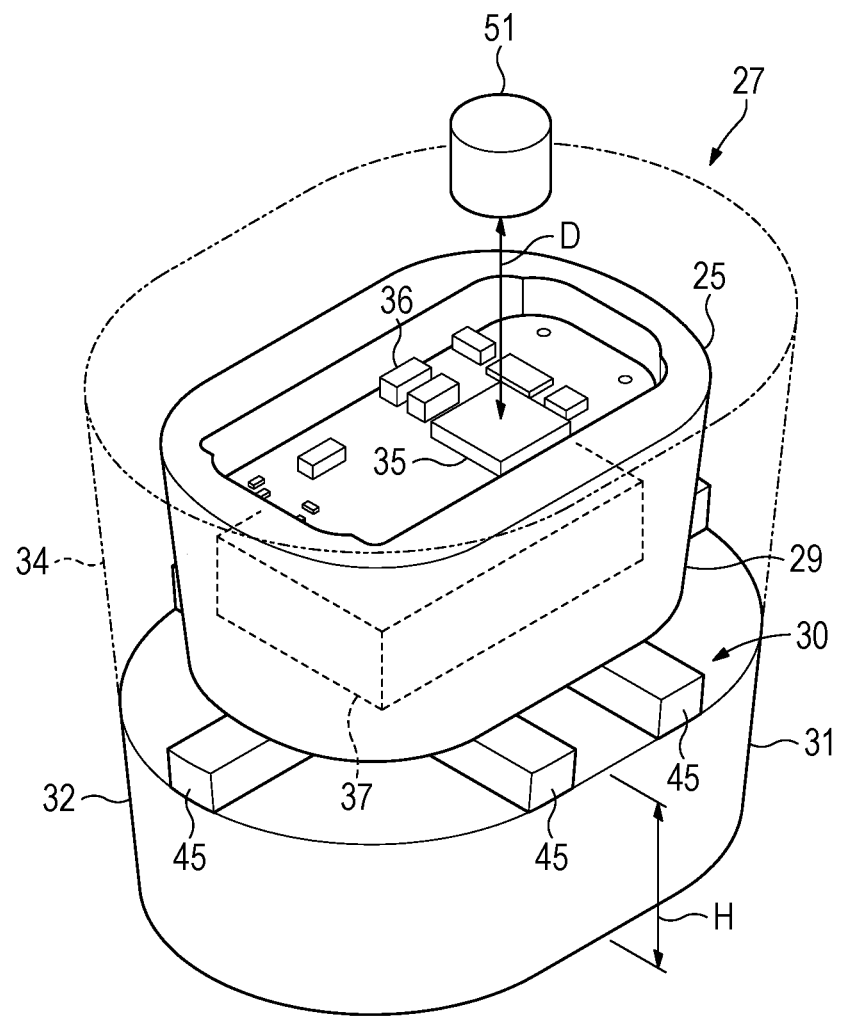
FIG. 8 is a perspective view of a monitoring device.

Referring to FIG. 8, the illustrated monitoring system 27 includes a monitoring device 25, a support 30, a body 31, and a proximity device 51 (e.g., secured to the lock). The monitoring device 25 includes a sensor 35 to detect at least one characteristic of the wear assembly (e.g., the presence and/or absence of proximity device 51), a communication device 36 (e.g., a transmitter and/or receiver) for wirelessly communicating information (e.g., a signal indicating the wear part has separated from the machine) to and/or from a remote device 38 (FIG. 1) to receive the signal, and a battery 37. These can be different components working together or they may be combined (e.g., the sensor 35 and communication device 36 may be the same component). Monitoring devices 25 also could have other constructions and/or other components. For example, monitoring devices 25 can include multiple sensors for redundancy and/or sensing other characteristics (e.g., high impact events, digging cycles, etc.), storage mediums for holding data (e.g., the part ID, software, firmware, etc.), a GPS device, and/or a microprocessor for processing data or other information.

In one example, the electronics or components of monitoring device 25 are positioned in a housing 29 (FIG. 8). The housing 29 is illustrated as a cup with an open top 47 but it could have other forms. The housing 29 can aid in supporting the monitoring device components, positioning the sensor 35 relative to the lock and/or providing protection for the monitoring device 25. The housing 29 may be situated to fit within the hole 49, such that the outer surface of the housing 29 engage the inner surfaces of the hole 49. In one example, the hole 49 converges toward one end, and the housing 29 converges generally in parallel with the inner surfaces of the hole 49 (e.g., 5°±0.5 degrees of convergence). The housing 29, though, could be secured in hole 49 in other ways; for example, the hole could be secured by adhesive, fasteners, friction, supports, etc. The monitoring device 25 may also be fit in hole 49 without contacting the walls of the hole; for example, a body or filler material 31 may be included in and/or around housing 29. The housing 29 could also be omitted.

In another example, the monitoring system 27 may include a support 30 in hole 49 for positioning monitoring device 25. Support 30 is illustrated (FIG. 8) with a grate configuration but other kinds of supports could be used. The support 30 can provide tolerance in examples using a complementary tapering of the housing 29 and walls of hole 49 to ensure the desired positioning of the monitoring device. The support 30 can also position the monitoring device in hole 49 without tapering walls. In the illustrated example, the support 30 may include of a plurality of cross beams 45. The height of the individual plurality of cross beams 45 may aid in better positioning of the sensor 35 within hole 49. The support 30 may bite into the inner walls of hole 40 to act as a grip and/or be secured in other ways such as by adhesive, fasteners, etc. Alternatively, housing 29, body 31 or other component of the monitoring device 25 could be secured to the walls of hole 49 without a separate support such as by friction, adhesive, fasteners, etc.

In the illustrated example, the body 31 is a material that envelopes the sensor 35 and the housing 29 and the empty space of the hole 49, but it could be used to cover and/or fill less than these components and/or spaces. The body 31 can protect the sensor 35 from water, fines, corrosive material and the like, and/or from impacts, strains and the like that may occur during use. The body 31 may be a filler material in the form of resin, polymer, polyurethane, or other suitable material that plugs the hole 49. The body 31 may be a dielectric material to improve transmission of the wireless signals. The body 31 may be composed of elastomers, thermoplastics, thermosets, and/or other non-conductive materials.

The body 31 may optionally be made up of two (or more) different materials. In one example, the body 31 may be composed of different gauged durometer hardness scale materials including, e.g., a first portion 32 and a second portion 34. In the illustrated embodiment, the first portion 32 is located farther from the lock. In an example such as shown in FIGS. 7A and 7B, the first portion 32 may come into contact with the inner walls of the cavity 18 of the point (i.e., opposite hole 48). Contact with the inner walls of the point cavity can, e.g., cause impacts applied to the point 15 during use to be translated to the monitoring device 25. In such an arrangement, the first portion 32 can be made of a softer material than the second portion 34 to better absorb these impacts and provide enhanced protection for monitoring device 25. While the first softer portion 32 is illustrated in FIG. 8 as being on one side of the monitoring device opposite lock 21, a softer portion 32 could have other configurations. For example, a softer portion of the body could surround the entire firmer portion of the body. The second portion 34 can be of a firmer material that better holds and supports the monitoring device; for example, a firmer second portion 34 can alleviate a risk of the housing 29 compressing into the softer first portion 32 and becoming undesirably spaced from proximity device 51 and/or lock 21. Other arrangements besides harder and softer could be used when relying on more than one body material. As one example, the second section 34 may be a dielectric for improving the transmission of signals from and/or to communication device 36 and the first section not a dielectric material (e.g., chosen for a different purpose such as for improve protection). Multiple purposes could, of course, be considered when choosing the material(s) for the body 31.

In the example shown in FIG. 8, the first portion 32 has a height H that can create a support for the housing 29 to set against and be positioned in hole 49 (with or without support 30). The positioning of sensors 35 by the first portion 32, support 30, housing 29 and/or other means to a particular location in hole 49 can improve the operation of the sensor 35, i.e., by setting the sensor a desired distance D away from the lock and/or a proximity device 51B secured to the lock 21. Positioning monitoring device 25 in hole 49 at a desired location can also alleviate the potential interference between the monitoring device 25 and the lock 21. The support 30 can optionally act as a barrier such that the sensor 35 does not penetrate into the lower level 32.

As noted above, the second portion 34 can be made from a dielectric material and may be a harder or firmer material than the first portion 32 (e.g. 85A). In the illustrated example, the first portion 34 fills the area above the second portion 32 but other arrangements are possible. The first portion can fill the space between the support 30 (if included) and potted into the open top 47 of the housing 29.

The monitoring device 25 can be secured in hole 49 by any suitable means including, for example, bolts, adhesive, brackets, taper fit, friction, etc. The components of the monitoring device can optionally be encased in a housing 29 and/or the hole 49 may be filled in with a filler or body 31 as will be further discussed below. Alternatively, the monitoring device 25 may not include a housing 29 or body 31, and/or hole 49 may not be filled in. Securing the components of the monitoring device 25 in a housing and/or body, and/or filling the hole 49 (i.e., outside of where the lock is received when securing the wear part to the base) with a suitable material may provide greater protection for the device 25 from water, fines, vibration, impact, etc. as the ground engaging product engages the material to be excavated or is otherwise worked. The use of a suitable body 31 material may optionally function to secure the monitoring device in hole 49. Monitoring device 25 can be constructed to be removably secured in hole 49 within the base, though it could be permanently secured. Removably securing the monitoring device 25 allows the device 25 to be temporarily installed in the ground engaging product, replaced when it breaks and/or when the battery is depleted, and/or removed at the end of life of the adapter 11. Removal of device 25 with its battery 37 may enable easier shipping, and/or conventional recycling of the bases when removed from the equipment. Removal may also permit successive use in other wear parts.

In one example of installing the monitoring system 27, a body 31 encasing monitoring device 25 may be formed in mold in the shape of the hole 49 so the monitoring device 33 can be installed as a unit into hole 49. Although at times the body has been referred to as an element in addition to the monitoring device, in this arrangement, the body could be considered a part of the monitoring device 25. In another example of installing monitoring system 27, the first portion material may be injected into mold to form a first portion 32 of body 31. The support 30 may be inserted into mold adjacent the first portion of the shell 32. The housing 29 with sensor 35 may be installed against support 30. In this example, housing 29 does not engage the first portion of the body. A second portion 34 of the body may be injected into the mold to completely surround and envelop the area above the first portion 32. The mold may be placed into a furnace to set the material(s) of the first and second portions 32, 34. The molded together body portions 32, 34, support 30 and monitoring device 25 are installed in hole 49 as a unit. In this arrangement, the body 31 and support 30 could be considered part of the monitoring device. When the monitoring system 27 is installed into the hole, if the first portion 32 passes through the bottom opening of the hole 49, then when the ground engaging part is placed over the nose of the underlying ground engaging part, the lower level 32 will be pushed up into the hole 49 and will be positioned correctly. As another example, the body 31, support 30 and/or monitoring device 25 could be installed directly into hole 49 and instead of being formed first in a mold. These are intended as examples; the monitoring device could be installed in the base in a wide variety of ways and using many different materials.

In the illustrated example of FIG. 7A, the monitoring system 27 includes a monitoring device 25 that includes a sensor to detect the presence and/or absence of the lock in hole 49, which in this case is the leading end of pin 150, without the use of a proximity device on the lock. Otherwise, this monitoring system can include the variations disclosed above in regard to the example of FIG. 7B.

Figure 9:
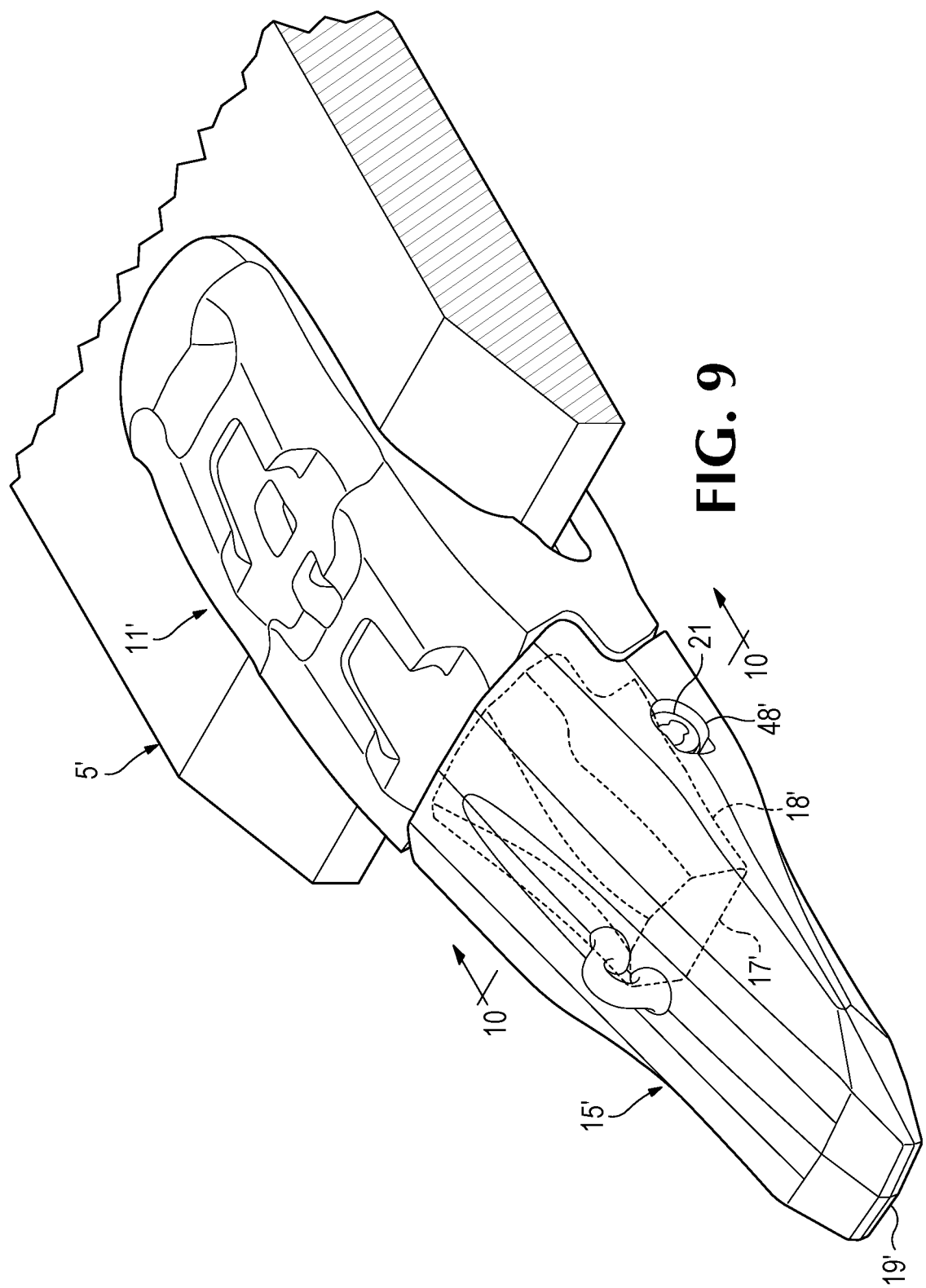
FIG. 9 is a perspective view of an alternative tooth assembly.
Figure 10:
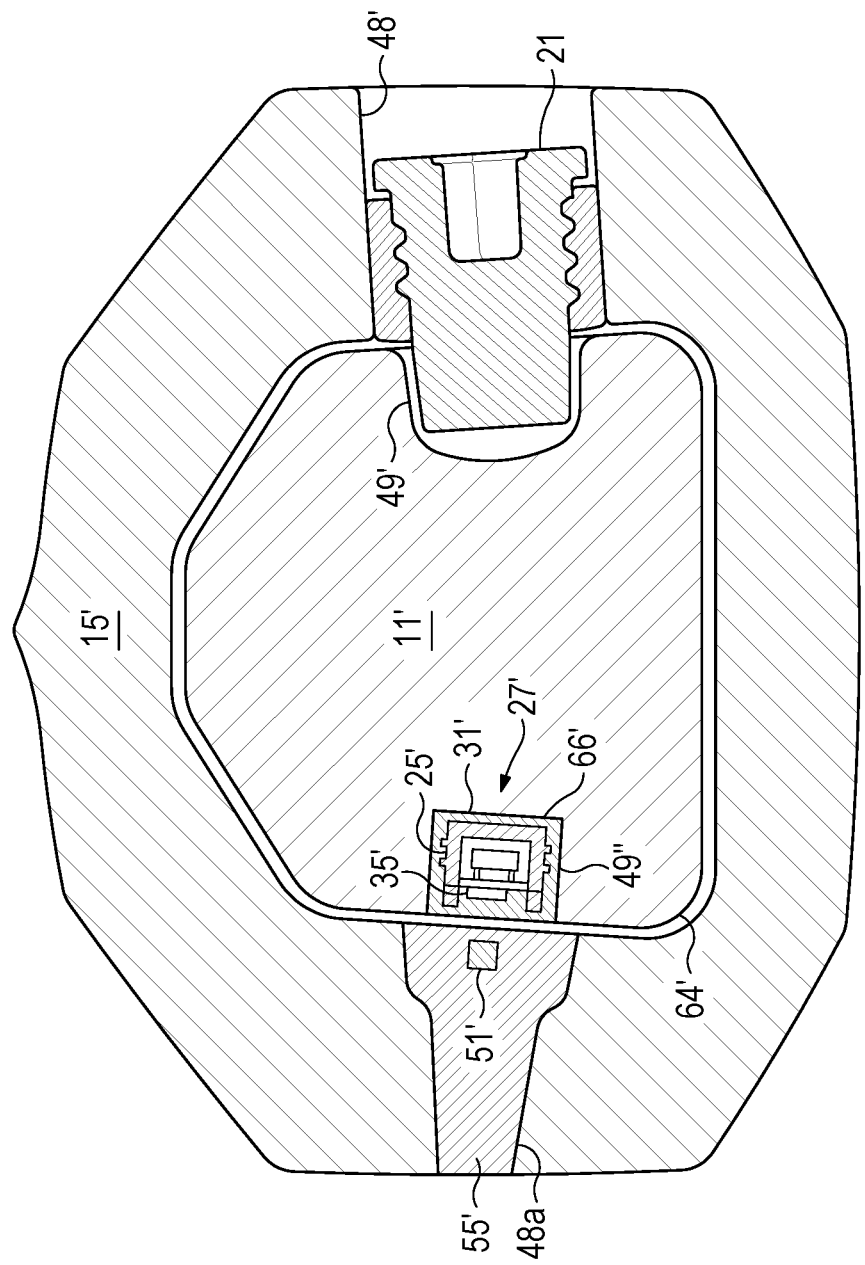
FIG. 10 is a cross-sectional view taken along line 10-10 in FIG. 9, showing a third example of a monitoring system according to the present disclosure.

Referring to FIGS. 9-10, an alternative tooth 7' is provided as another example. The alternative tooth 7' includes an adapter 11' welded to the lip 5' and a point 15' mounted on the adapter 11'. Point 15' includes a rearward-opening cavity 18' to receive a nose 17', and a front end 19' to penetrate the ground. A lock 21 is situated into an opening 48' formed on one side of the point 15' and at least one hole 49' in the adapter 11'. Hole 49' is aligned with lock opening 48' to receive a leading end 22 of lock 21 to secure the point 15' to the adapter 11'. Although not shown, the monitoring device 25 could be positioned adjacent the leading end 22 of lock 21 such as shown in FIGS. 7A and 7B to detect the presence and/or absence of the lock 21.

In the example as shown in FIGS. 9-10, the monitoring system 25' is situated in a hole 49" separate from the lock-receiving hole 49'. In the illustrated example, hole 49" is in the side of the base opposite the side receiving the lock 21. However, hole 49" could be provided in other surfaces and other locations. A plug or insert 55' may be optionally received in hole 48a to set adjacent monitoring device 25'. In this example, the plug 55' sets opposite lock 21. Hole 48" is shown in FIG. 10 to have a unique shape but it could have other shapes such as matching the shape of hole 48' so the lock and plug can be reversed to permit reversing of the wear part, a simple cylindrical shape, etc. The plug 55' may optionally include a proximity device (e.g., an RFID tag, magnet 51', etc.). The plug 55' may be made from the same or different materials as disclosed for body 31. For example, a dielectric material may be used to aid in signal transmission. Alternatively, the monitoring device 25' could detect the presence and/or absence of a portion of the wear part without a plug and/or proximity device. In this arrangement, the body 31 can fill to the height of the inner walls of the hole 49 and fully plug the hole but it can have other arrangements. Also, the holes 48a and/or 49" could optionally have other additional purposes; e.g. holes 48a and/or 49" could be provided to alternatively receive a lifting eye or other attachment. As another alternative, a plurality of monitoring devices could be provided to redundantly detect separation of the wear part and/or other characteristics of the wear assembly to increase the reliability of the system.

Figure 11:
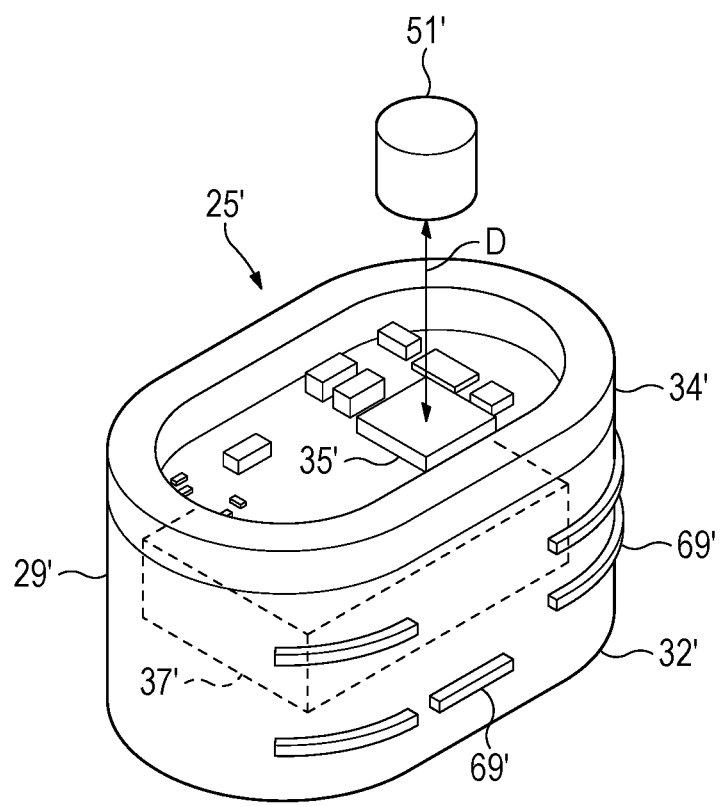
FIG. 11 is a perspective view of a second monitoring device.

In the illustrated example of FIG. 11, the monitoring device 25' includes a sensor 35', a transceiver, and a battery. The sensor 35' may be a Hall effect sensor that functions with a magnet 51'. The monitoring device 25' could be located in a hole 49" in the base that is or is not for receiving a lock but is disclosed with reference to hole 49". The housing 29' of the monitoring device 25' may include one or more retainers 69' to frictionally hold the body 31' within hole 49" though other arrangements are possible. The retainers 69' may be formed as ribs that generally extend around the sides of the outer edges to contact the surfaces of hole 49". The body 31' can be secured within a complementary hole recess via an interference fit so that the ribs of retainers 69' contact the sides of the recess to secure the body 31' within the hole 49". Other retainers are possible, and the ribs are only one example of a retainer that may be used to secure the body within the recess. Other ways of securing the body within the hole 49" are possible. For example, the retainer may be a series of helical ridges that correspond to grooves in the recess. The body may be threaded or otherwise rotated so that the retainer engages the corresponding grooves in hole 49". Alternatively, as an example, one or more latches could be used to secure the body in place. Further, retainers could be formed in the hole instead of or in addition to retainers on the body. Other means for securing the monitoring device 25' in hole 49" could be used such as adhesive, fasteners, friction, etc. One or both ends of the monitoring device can have a removal feature (e.g., a loop or head) to remove the monitoring device from the hole. When the hole receiving the monitoring device is a through-hole, the monitoring device may be removed by pressing upwards from the bottom of hole.

Figure 12:
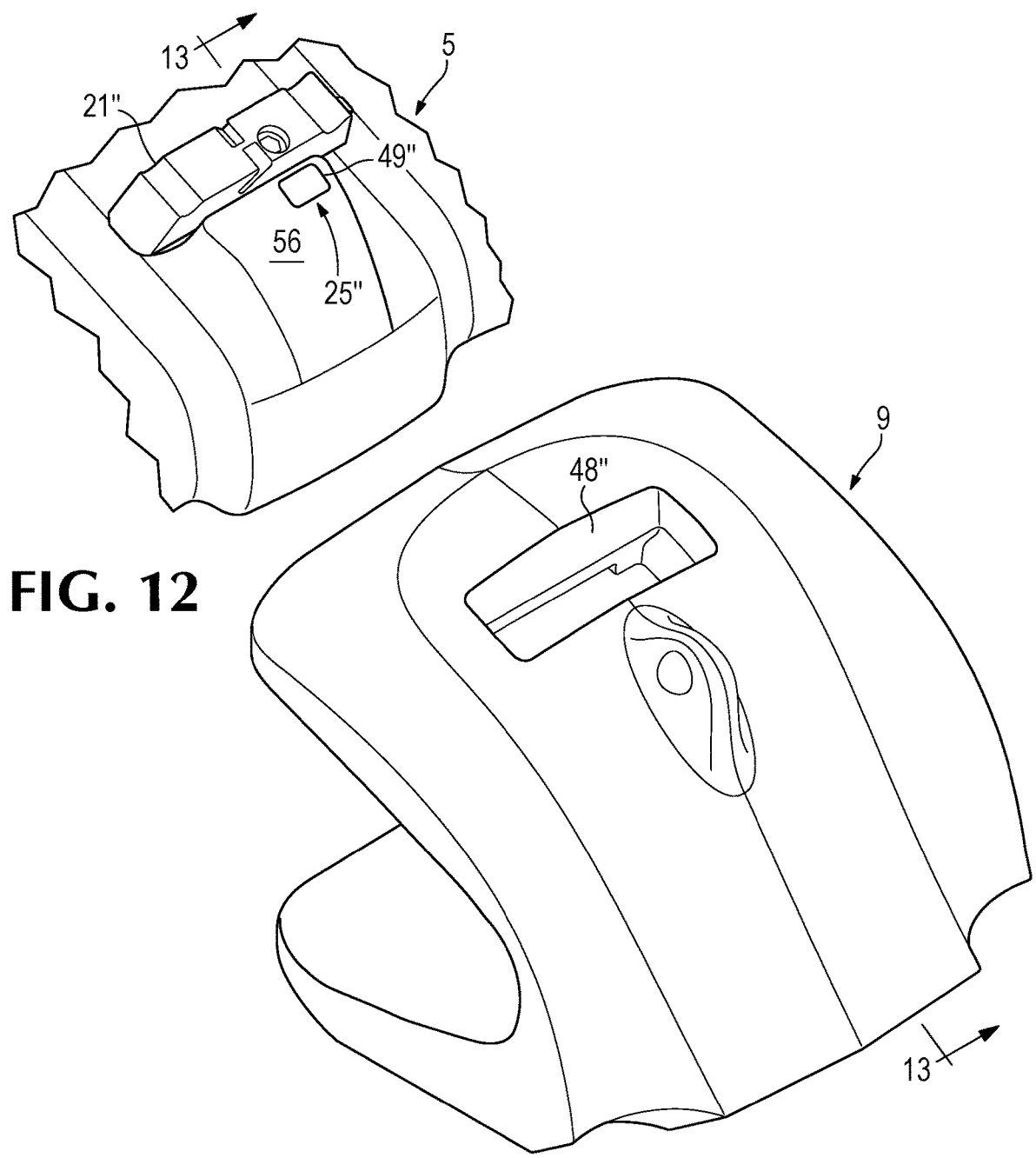
FIG. 12 is a partial exploded perspective view of the shroud assembly of FIG. 3.
Figure 13:
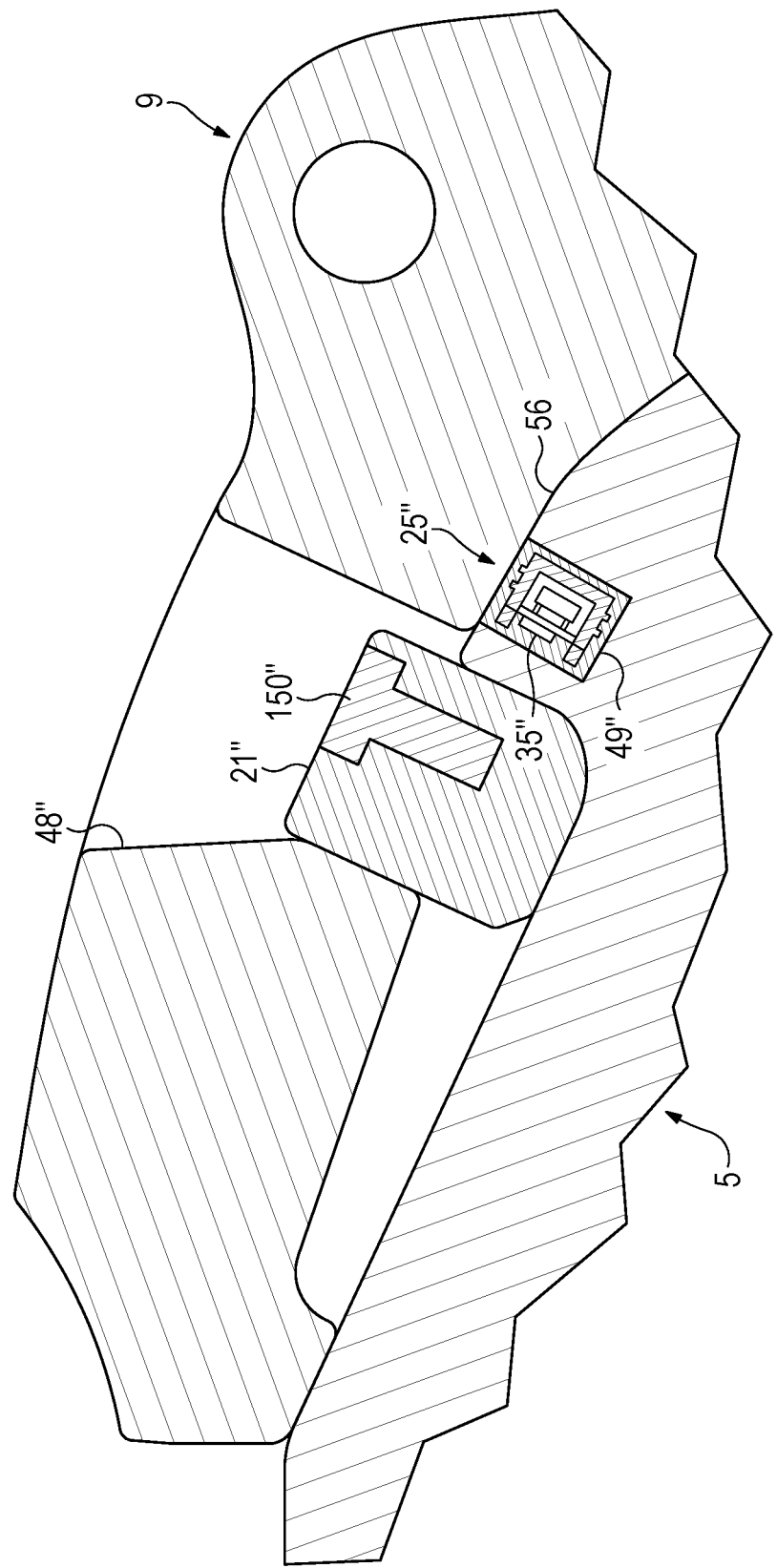
FIG. 13 is a partial cross-sectional view taken along line 13-13 in FIG. 12, showing a fourth example of a monitoring system according to the present disclosure.

Referring to FIGS. 12-13, the illustrated shroud assembly includes a shroud 9 mountable onto a lip 5. In this example, the shroud fits over a boss 56 of lip 5 but other arrangements are possible. Shroud 9 includes an opening 48" to receive a lock 21" that holds the shroud 9 to the lip 5. The shroud and lock could have a construction such as disclosed in U.S. Pat. No. 7,536,811 or 10,612,214, which are each incorporated herein by reference. The shroud could alternatively mount to a sidewall of a bucket as an upper and/or a lower wing shroud (not shown). Monitoring device 25" is positioned in hole 49" formed in boss 56 so as to be adjacent a portion of shroud 9 (See FIG. 13). Alternatively, hole 49" and monitoring device 25" could be located in a sidewall of boss 56, e.g., perpendicular to the lip. Alternatively, the hole 49" could be re-oriented 90° so the monitoring device detected the presence and/or absence of the lock 21" when the shroud is installed on the boss 56 and lock 21" is inserted in hole 48". In another example, the monitoring device 25 may be located in a thrust block, which may, e.g., abut a rear and/or side of a wing shroud. The monitoring device 25" would, then, detect the presence and/or absence of the lock as discussed earlier in regard to the other examples. Alternatively, hole 49" and monitoring device 25" could be provided in the lip to underlie the lock or a different portion of shroud 9 to detect the presence and/or absence of the lock or shroud, respectively. The lock 21" may or may not have a proximity device (e.g., a magnet, RFID tag, etc.) to work with the monitoring device 25". The monitoring device could also monitor the presence and/or absence of shroud 9 with or without a plug and/or proximity device in the shroud.

Figure 14:
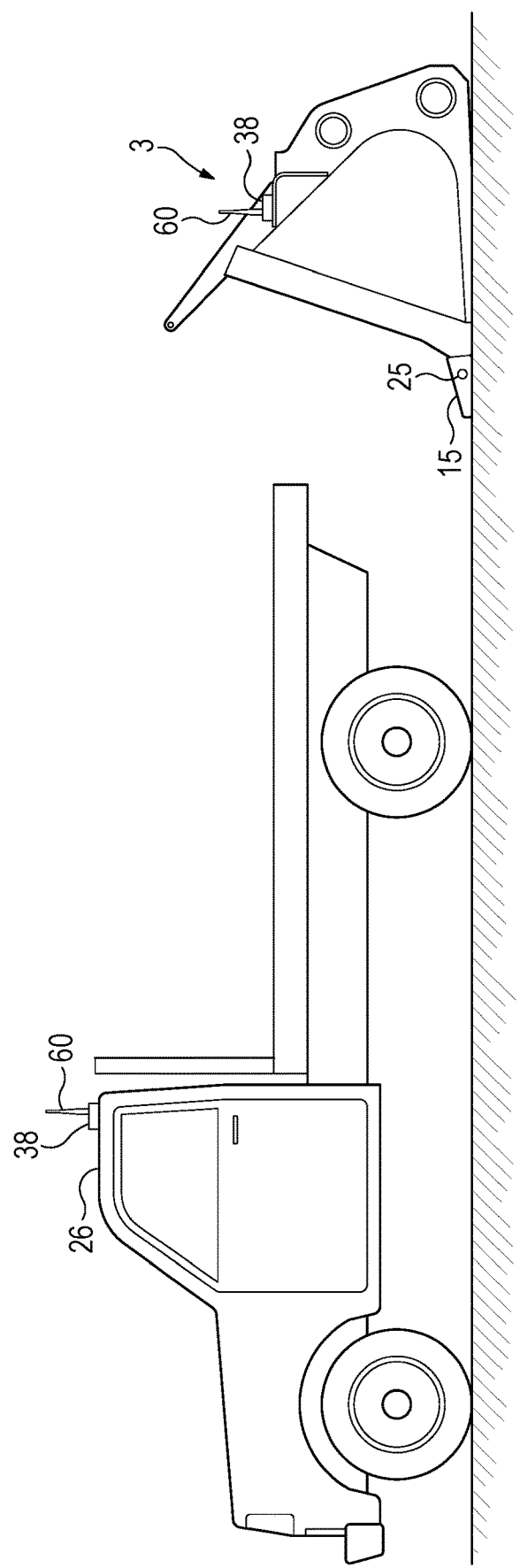
FIG. 14 is a side view of a service truck and a bucket.
Figure 15:
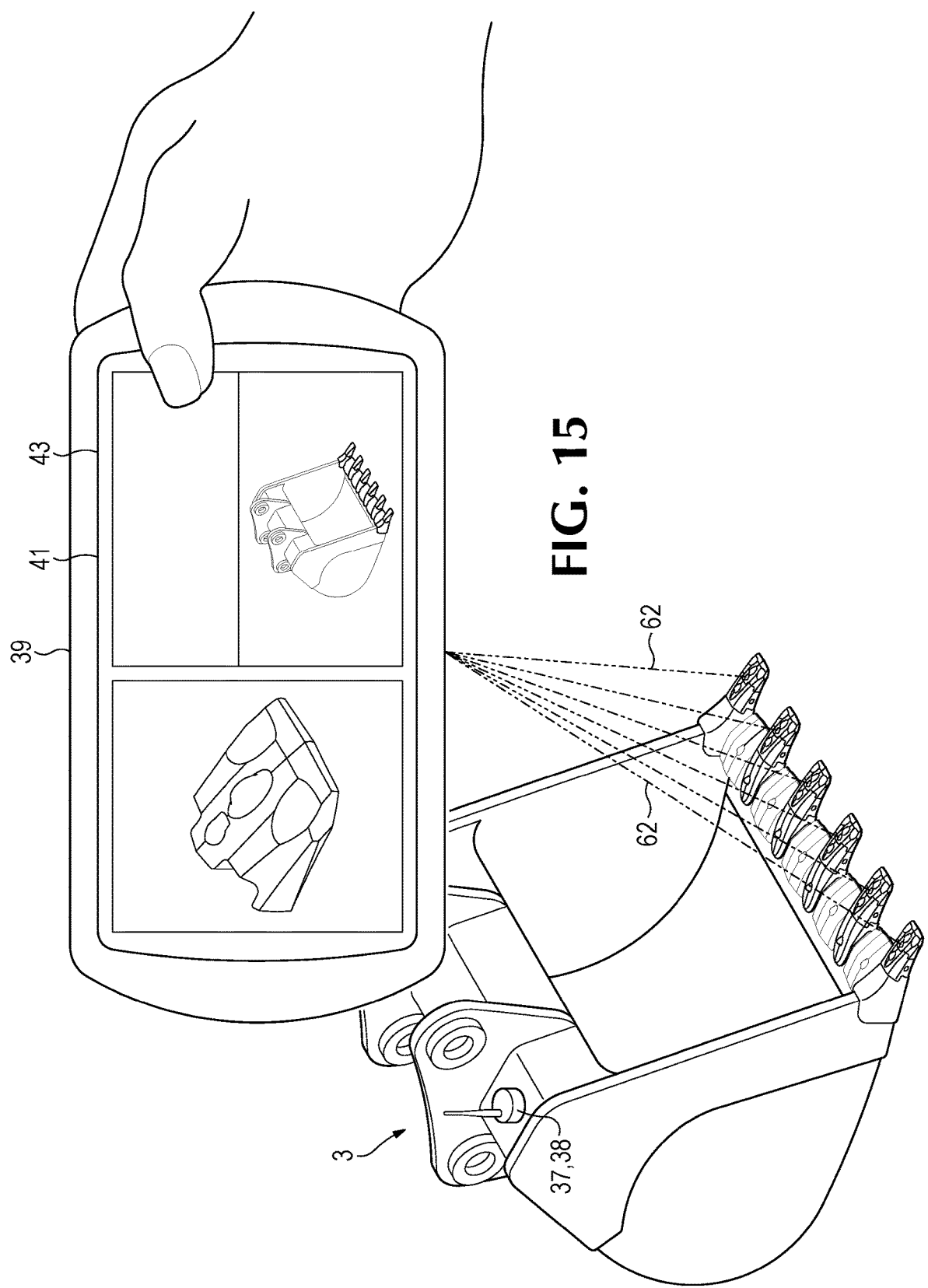
FIG. 15 is a perspective view of bucket and a handheld remote device.

Monitoring device 25 (or any of the other examples) may communicate with a remote device 38, which simply means a device remote from the monitoring device 25. The remote device 38 can, for example, be secured to one or more of the bucket 3 (FIGS. 2, 11, and 12), the boom 2 (FIG. 1), the stick 20 (FIG. 1), the cab 24 of the digging machine 1 (FIG. 1), a service truck (FIG. 14), a drone, a handheld device 39 (FIG. 15), a station, etc. The remote device 38 can be a single component or a collection of components working together or separately. For example, a remote device 38 may include one or more of a processor 198 (PC, microprocessor, etc.), memory 200, a database 194, a transmitter, a receiver, a transceiver 60, etc. (FIG. 1). The remote device 38 may include one or more receivers (e.g., antennae) to receive the wireless signals 62 from the monitoring device(s) 25, a transmitter(s) to transmit signals, or a transceiver 60, a processor(s) to process information received from the monitoring device(s), a database(s) to store information, a human-machine interface(s), etc. The remote device 38 may communicate with additional sensors on the ground engaging product, other ground engaging products, multiple ground engaging products, earth working equipment 1 and/or with a database(s) and/or computer(s). The remote device 38, for example, may be a wireless device or a wired device. The term remote device 38 herein encompasses all such variations. Various examples may locate one or more components of the remote device 38 at predetermined points on the digging machine 1 and/or other vehicles 26 and pieces of equipment and/or in office space. Various examples may include mobile and handheld devices 39 as components of the remote device (FIG. 15). Examples may provide electronic canvassing of the sensors and/or communication devices to inventory the data collected. The data may be combined with previously known data and/or data collected from other locations. One or more programmable logic device may be utilized to manipulate the data into various machine usable and human usable formats, and/or to make various assessments.

The monitoring device 25 and/or remote device 38 may, for example, include a transceiver 60, for example, a radio frequency communication device, an electromagnetic wave receiver and/or transmitter, a mechanical wave receiver and/or transmitter, and/or Global Positioning System (GPS). The electromagnetic waves may have a wavelength outside of the visible spectrum (e.g., infrared, microwave, or Radio Frequency [RF]), and may be in the ultrasonic spectrum. As one example, the communication device could transmit a Bluetooth signal at 2.4 Gigahertz, but other means and other frequencies could be used.

The monitoring device 25 sends a wireless signal 62 regarding the detected characteristic(s) to the remote device 38 (FIG. 1). The signal 62 may, e.g., be continual, intermittent, batch, event driven, etc. In the illustrated example, the signal 62 is received by a transceiver 60 (e.g., an antenna) of remote device 38 mounted on the boom 2 of the excavator 1 (FIG. 1). An antenna 60 can be provided in other positions and/or mounted on different supports (e.g., on the bucket 3, near the cab 24, etc.) in lieu of or in addition to the antenna on the boom. The antenna 60 on the cab 24 in this example is shown wired 197 to a processor 198 having memory 200 in the cab 24 but could have a different connection or location. For example, an antenna 60 or other receiver could be mounted near the cab, on a service truck, on a handheld device 39, etc. The antenna 60 could be coupled to a wireless transmitter such that the information received from the monitoring device 25 and sent to the remote device 38 in the cab, may be provided to and/or combined with data from a handheld device 39, cloud database 194, other data sources, etc. to provide helpful information and/or analysis. Multiple antennas 60 could be used to increase the reliability of picking up the signal if desired or needed for the operation.

In cases where signals can only be received at certain times, monitoring device 25 and/or remote device 38 may transmit only during certain times (e.g., when the bucket is oriented in a particular way, when a trigger signal is received, etc.) or may continue to transmit continually. The monitoring device 25 may optionally transmit only when sensor detects the lock and/or wear part has separated from the base. Further, multiple remote devices and/or antennas could be used to receive information from the monitoring device continually or during longer periods even if the signal can only be accessed by the antenna on the boom 2 during certain intervals. A component of the remote device 38 may receive a signal 62 from a monitoring device 25 and relay the signal 62 to a second or third component of the remote device (FIG. 1). Any number of remote device components may be used to relay the signals as needed. The movement of the digging machine 1, including the individual articulated components thereof, and/or other vehicles at the worksite may tend to establish and reestablish the interrelationships of the sensors and communication devices. In this way, various and numerous communication paths may be established despite the great number of potentially shielding surfaces at the worksite.

In examples detecting separation, the loss of the lock 21 and/or the overlaying wear part, tends to lessen the signal blocking effects, which has the effect of increasing the likelihood of the remote device 38 receiving the signals from the monitoring device 25, which thus may increase the reliability of the system. The monitoring device 25 could operate only when the wear part separates, or it could operate continually. Continual operation provides the added benefit of ensuring the monitoring device is still operating and/or sensing other characteristics. A monitoring device may optionally increase the magnitude and/or speed of repetition of the signal it transmits when absence of the lock and/or wear part are detected so as to increase the likelihood the remote device 38 receives the signal indicating the wear part has separated from the base. Increasing the likelihood, the remote device receives the signal can improve the reliability of the monitoring system. As a lost wear part may not include a tracking device, the location of the wear member may be unknown upon separation. In such situations, the advantage of receiving the identifying signal at the moment of separation increases the likelihood of locating the lost wear part. The monitoring device 25 may optionally include additional sensors (e.g., one or more of a GPS, accelerometer, inclinometer, etc.) located in the base, which can determine the path of the last digging cycle or bucket payload to determine the area of where the lost wear part may be found. In the illustrated tooth 7 of FIGS. 3-5, a first monitoring device 25 may be located in hole 49 of the base adapter 11 adjacent lock 21 securing the intermediate adapter 13 to base adapter 11, and a second monitoring device 25 in hole 49 of the intermediate adapter 13 adjacent lock 21 securing point 15 to intermediate adapter 13. In such an implementation, if the point 15 and the intermediate adapter 13 are lost together, the intermediate adapter may include a sensor that signals the location of the intermediate adapter 13. Other tags, sensors, etc. could also optionally be included in the wear part (e.g., as disclosed in U.S. Pat. No. 10,011,975).

The remote device 38 and/or the monitoring device 25 may on their own, collectively, and/or with other devices, and/or software applications, and the like (e.g., data 200 from a database 194 in, for example, a cloud database, other processors, etc.), store, process and/or communicate information or data 200 related to a characteristic of the wear part. Monitoring device 25 may along with detecting separation also optionally (or in lieu of detecting separation) include one or more sensors for identifying other characteristics of the wear assembly besides separation of the wear part including, for example, part ID, usage, strain, temperature, acceleration, inclination, etc. of a ground engaging product such as tooth 7, shroud 9 or other wear assembly for earth working equipment. (FIG. 1). Information related to the part ID can include such things as ground engaging product type, part number, customer, brand name, trademark, manufacturer, bill of materials, etc. The part ID may be used as search criteria in order to retrieve additional information regarding the specific ground engaging product. The search criteria may be used to query one or more relational databases and/or broader data structures. Information related to usage can include such things as the kind of machine to which the ground engaging product is secured, time the ground engaging product went into service, how many digging cycles the ground engaging product has experienced, average time of the digging cycles, location of the ground engaging product on the machine, impact events, etc. These monitored characteristics are given as examples only and are not intended to be limiting. Information may be shared with, i.e., sent to and/or received from, various other machines including programmable logic, other networks, and used with various software applications, and routines.

The monitoring device 25 and/or remote device 38 can use programmable logic to process information generated from, e.g., monitoring device(s) 25 and/or the remote device(s) 38 for monitoring characteristics such as the part ID, presence, condition, performance, and/or usage of the ground engaging product being monitored and/or providing alerts to the operator. Processors (e.g., microprocessors), using programmable logic may be part of monitoring device 25 and/or a remote device 38. The programmable logic included in a remote device 38 may, for example, use information received from monitoring device 25 to identify that the ground engaging product is still secured to the base. When the ground engaging product has unexpectedly been separated from the base, the monitoring device 25 may send an alert signal indicating a change in the condition of the ground-engaging product. In another example, the processor may use information about the geology of the mine site in combination with usage information from monitoring device 25 to determine, e.g., the estimated wear life remaining for the ground engaging product. For example, the programmable logic may use the number of digging cycles and/or the duration that a ground engaging product has been in service to determine the estimated wear life remaining. The programmable logic may be programed to produce a precautionary alert that a specific ground engaging product is close to needing replacement. The alert may be, for example, a visual alert, haptic feedback, and/or an audio alert. The devices 25 and/or 38 may provide the alerts to devices for access by the operator or others such as maintenance personnel, mine site managers, or the like. In addition, the programmable logic may be programed to produce an alert if the condition indicates, e.g., that the ground engaging product has been unexpectedly separated from the base.

In one implementation, the results and alerts from the process may be sent to at least one Human-Machine Interface (HMI) 41. The HMI could, e.g., be a handheld device 39 as shown in FIG. 12, mounted in a cab of a vehicle such as a digging machine or haul truck, or in an on-site or off-site location. The features, events, data or the like detected by the monitoring device can be processed with other collected or stored data by programmable logic to determine a wide variety of factors that may influence the machine operator. The system may make determinations by including outside factors such as the hardness or abrasiveness of the earthen material being worked, the material composition of the ground engaging product being monitored, etc. Also, as discussed earlier, the system may be coordinated with a ground-engaging inventory and supply system. The system may also be coordinated with other kinds of information such as scheduled maintenance to determine the most efficient time to replace or maintain the ground engaging product being monitored. In turn, the HMI 41 can on the basis of the detected features and/or processed information provide alerts, data, expected wear lives, and the like for more efficient use of the earth working equipment.

The HMI 41 may be hard wired or may be a wireless device, may be integrated with a display system currently in the excavating equipment (e.g., with the OEM display), integrated with a new display system within the excavating equipment, and/or may be in a remote location. The HMI 41 may be configured to provide a graphical display of the current condition of the ground engaging product. The HMI 41 may, for example, provide visual alerts (e.g., text and/or pictorial images), haptic feedback (e.g., vibrations), and/or audio alerts regarding each ground engaging product. The visual alert may be, for example, a graphical picture displaying each ground engaging product and the condition of each ground engaging product (i.e., absent/present, needing maintenance, etc.). The HMI 41 may be designed to display a history chart so that an operator can determine when an alert happened so that an operator can take the necessary actions if a ground engaging product is unexpectedly separated. The HMI 41 may include a display 43. The display 43 may include various visual indicators including but not limited to: photographs or real time images of, for example, similar ground engaging products from a database; photographs taken with camera at the worksite, such as with camera 190 on boom 2 (FIG. 1); remaining wear life; bucket configuration; etc.

In one example, a camera could be attached to, e.g., the bucket 3, the boom 2, the stick 20, the machine 1, drone, service truck 26, or other support to provide a visual double check for the operator. In the illustrated example, a camera 190 is secured to the boom 2 to capture (at least part of the time) a visual image of the ground engaging products attached to the bucket 3. When the machine display (or another) receives an alert that, e.g., a ground engaging product has separated, a display showing the visual image within the cab can be checked to ensure the noted ground engaging product is actually missing from the bucket. The checking may use computer vision, which has been programmed to look for ground engaging products in a specific location. This backup system can reduce false alarms that cause the operator to stop operation of the machine.

In another example, systems involving cameras such as used in prior art systems or as disclosed in U.S. Patent Application 2016/0237640, which is incorporated by reference in its entirety, can be used in combination with the monitoring systems described in this application. The information received from the camera-based systems can be used as a backup double check to reduce the number of false alarms. Alternatively, the monitoring devices 25 disclosed herein could be a backup double check for the camera-based monitoring systems. Further, the data collected by both a camera-based monitoring system and a non-camera based monitoring system (such as disclosed herein) could be collectively processed to determine, e.g., the part ID, presence, usage, condition and/or performance of the ground engaging product. The full data received by both systems could lead to more reliable conclusions and assessments. The performance of the ground engaging product could be related to the number of digging cycles and/or the length of said digging cycles. Digging cycles may be measured from the time of impact with the ground to the next impact with the ground. Digging cycles may also be measured as operational cycles, which is the amount of time required to fill a load container.

The monitoring device 25 may also communicate with other computer systems, wirelessly or through a cable, the specific ground engaging product(s) needing maintenance either because the ground engaging product is separated or because there is an indication that the ground engaging product may need maintenance. The monitoring device may store all the results from the process.

The above disclosure describes specific examples ground engaging products and systems for identifying characteristics such as the part ID, usage and/or presence of a ground engaging product used on earth working equipment. The features in one example can be used with features of another example. The examples given, and the combination of features disclosed are not intended to be limiting in the sense that they must be used together.

The invention claimed is:

1. A wear assembly for earth working equipment, the wear assembly comprising:
   a base securable to the earth working equipment and including a mounting portion having a hole;
   a wear part including a cavity to receive the mounting portion of the base, and an opening that at least partially aligns with the hole in the base;
   a lock received in the opening in the wear part and the hole in the base to secure the wear part to the base; and
   a monitoring device in the hole in the base adjacent the lock when the lock is received in the hole to detect the presence and/or absence of the lock, and to wirelessly transmit a signal to indicate when the lock is absent from the base.

2. The wear assembly of claim 1 wherein the lock includes a proximity device that is detected by the monitoring device to determine whether the lock is present and/or absent.

3. The wear assembly of claim 2 wherein the proximity device is a magnet.

4. The wear assembly of claim 2 wherein the proximity device is an RFID tag.

5. The wear assembly of claim 1 wherein the lock includes a leading end movable to be received in and out of the hole in the base, and the monitoring device is located within the hole adjacent the leading end of the lock when the leading end is received into the hole.

6. The wear assembly of claim 1 wherein a filler material at least partially fills the hole in the base.

7. The wear assembly of claim 6 wherein the filler material is a dielectric.

8. The wear assembly of claim 6 wherein the filler material includes a plurality of different portions composed of different materials.

9. The wear assembly of claim 1 wherein the base is an adapter.

10. The wear assembly of claim 9 wherein the wear part is a point.

11. The wear assembly of claim 1 wherein the wear part is an adapter.

12. A wear assembly for earth working equipment, the wear assembly comprising:
    a base securable to the earth working equipment and including a mounting portion having an exterior surface;
    a wear part including a cavity receiving the mounting portion of the base;
    a lock to secure the wear part to the base;
    a hole in the base that opens in the exterior surface of the base to receive a portion of the lock when the base, the wear part and the lock are assembled together; and
    a monitoring device in the hole in close proximity to the lock, the monitoring device being free of movable components to detect the presence and/or absence of the lock to determine whether the wear part has separated from the base, and to transmit a wireless signal when the lock is absent.

13. The wear assembly of claim 12 wherein the lock includes a proximity device that is detected by the monitoring device to determine the presence and/or absence of the lock.

14. The wear assembly of claim 13 wherein the proximity device is a magnet.

15. The wear assembly of claim 13 wherein the proximity device is an RFID tag.

16. The wear assembly of claim 12 wherein the base is an adapter.

17. The wear assembly of claim 16 wherein the wear part is a point.

18. The wear assembly of claim 12 wherein the wear part is an adapter.

19. The wear assembly of claim 12 wherein the wear part is a shroud.

20. A monitoring system for monitoring ground-engaging products secured to an earth working equipment, the system comprising:
- a base attachable to the earth working equipment and including a hole;
- a wear part including a cavity for receiving at least a portion of the base;
- a lock to secure the wear part to the base;
- a monitoring device in the hole of the base to detect separation of the lock, and a communication device to wirelessly transmit a first signal when the lock is detected as present and a second signal when the lock is detected as absent, wherein the second signal has a greater magnitude and/or a greater speed of repetition as compared to the first signal; and
- a remote device to receive the first and second signals from the monitoring device.

21. The monitoring system of claim 20 wherein the second signal has a greater magnitude than the first signal.

22. The monitoring system of claim 20 wherein the second signal has a great speed of repetition than the first signal.

23. The monitoring system of claim 20 wherein the wear part or the lock includes a proximity device, and the monitoring device detects the presence and/or absence of the proximity device.

24. The monitoring system of claim 23 wherein the proximity device is a RFID tag and the sensor is a RFID receiver.

25. The monitoring system of claim 23 wherein the proximity device is a magnet and the sensor is a Hall effect sensor.

26. A wear assembly for earth working equipment, the wear assembly comprising:
- a base securable to the earth working equipment;
- a wear part including a cavity to receive the base and an opening;
- a lock received in the opening in the wear part to secure the wear part to the base; and
- a monitoring device secured to the base to detect the presence and/or absence of the lock and to wirelessly transmit a signal to indicate when the lock is absent.

27. A monitoring system for earth working equipment comprising:
- a base securable to the earth working equipment;
- a wear part including a cavity to receive the base and an opening;
- a lock received in the opening in the wear part to secure the wear part to the base;
- a monitoring device secured to the base to detect the presence and/or absence of the lock and to wirelessly transmit a signal to indicate when the lock is absent;
- a remote device to receive the signal; and
- a processor that uses the signal to send an alert that the lock is absent.

* * * * *